United States Patent
Kunikiyo

(10) Patent No.: US 9,048,158 B2
(45) Date of Patent: Jun. 2, 2015

(54) SEMICONDUCTOR DEVICE WITH ISOLATION INSULATING LAYER CONTAINING AIR GAP

(71) Applicant: RENESAS ELECTRONICS CORPORATION, Kanagawa (JP)

(72) Inventor: Tatsuya Kunikiyo, Kanagawa (JP)

(73) Assignee: RENESAS ELECTRONICS CORPORATION, Kanagawa (JP)

(*) Notice: Subject to any disclaimer, the term of this patent is extended or adjusted under 35 U.S.C. 154(b) by 0 days.

(21) Appl. No.: 14/514,358

(22) Filed: Oct. 14, 2014

(65) Prior Publication Data

US 2015/0028404 A1    Jan. 29, 2015

Related U.S. Application Data

(63) Continuation of application No. 13/370,045, filed on Feb. 9, 2012, now Pat. No. 8,884,319.

(30) Foreign Application Priority Data

Feb. 25, 2011 (JP) ................................ 2011-040092

(51) Int. Cl.
H01L 33/00 (2010.01)
H01L 27/146 (2006.01)

(52) U.S. Cl.
CPC ...... *H01L 27/1463* (2013.01); *H01L 27/14643* (2013.01)

(58) Field of Classification Search
CPC .. H01L 33/0008; H01L 33/0041; H01L 33/08
USPC .................................................. 257/93, 101
See application file for complete search history.

(56) References Cited

U.S. PATENT DOCUMENTS

| 6,406,975 | B1 | 6/2002 | Lim et al. |
| 7,518,144 | B2 | 4/2009 | Hirata et al. |
| 7,579,637 | B2 | 8/2009 | Nam et al. |
| 2006/0027844 | A1 | 2/2006 | Jung |
| 2006/0220069 | A1 | 10/2006 | Cole et al. |
| 2011/0186918 | A1 | 8/2011 | Sung |

FOREIGN PATENT DOCUMENTS

| JP | 2002-203896 A | 7/2002 |
| JP | 2006-279048 A | 10/2006 |
| JP | 2007-227761 A | 9/2007 |
| JP | 2008-010544 A | 1/2008 |
| JP | 2009-267208 A | 11/2009 |
| WO | 2010/024595 A2 | 3/2010 |

OTHER PUBLICATIONS

United States Office Action issued in U.S. Appl. No. 13/370,045 dated Jan. 22, 2014.
United States Office Action issued in U.S. Appl. No. 13/370,045 dated May 13, 2014.
United States Notice of Allowance issued in U.S. Appl. No. 13/370,045 dated Jul. 11, 2014.

*Primary Examiner* — Kevin Parendo
(74) *Attorney, Agent, or Firm* — McDermott Will & Emery LLP

(57) ABSTRACT

A semiconductor device having a solid-state image sensor which can prevent inter-pixel crosstalk more reliably. The device includes: a semiconductor substrate having a main surface; a first conductivity type impurity layer located over the main surface of the substrate; a photoelectric transducer including a first conductivity type impurity region and a second conductivity type impurity region which are joined to each other over the first conductivity type impurity layer; and transistors which configure a unit pixel including the photoelectric transducer and are electrically coupled to the photoelectric transducer. At least part of the area around the photoelectric transducer in a plan view contains an air gap and also has an isolation insulating layer for electrically insulating the photoelectric transducer and a photoelectric transducer adjacent to it from each other. The isolation insulating layer abuts on the top surface of the first conductivity type impurity layer.

7 Claims, 24 Drawing Sheets

SEMICONDUCTOR DEVICE WITH ISOLATION INSULATING LAYER CONTAINING AIR GAP

CROSS-REFERENCE TO RELATED APPLICATIONS

This application is a Continuation Application of U.S. patent application Ser. No. 13/370,045, filed on Feb. 9, 2012, which claims priority of Japanese Patent Application No. 2011-40092, filed on Feb. 25, 2011 the disclosures of which are incorporated herein by reference in their entireties.

BACKGROUND

The present invention relates to semiconductor devices and more particularly to a semiconductor device having a solid-state image sensor.

In CMOS (Complementary Metal Oxide Semiconductor) image sensors, each unit pixel includes a microlens, a red, green or blue color filter, and a photoelectric transducer such as a photodiode. The wavelength of light passing through the color filter of a unit pixel and arriving at the photoelectric transducer depends on the filter color. The light which has entered the photoelectric transducer through the color filter of the unit pixel is converted into an electrical signal and the electrical signal is detected inside the unit pixel. An image sensor in which a plurality of unit pixels with different color filters are arranged over a semiconductor substrate and spaced from one another is disclosed, for example, in Japanese Unexamined Patent Publication No. 2006-279048.

In an image sensor, the light passing through a red color filter has a long wavelength and reaches deep inside a laminated structure, for example, of silicon. Therefore, this light gets into a deeper region (near to the bottom surface) of a semiconductor substrate, for example, of silicon. Some of the electrons generated by photoelectric conversion of the red light which has arrived at the photoelectric transducer are collected by the unit pixel having the red filter by diffusion or drifting. However, it may happen that some of the electrons generated by photoelectric conversion of the red light are wrongly collected by an adjacent unit pixel having, for example, a green color filter by diffusion or drifting. This phenomenon is called electrical crosstalk. Or the light which has passed through the red color filter may accidentally get into an adjacent unit pixel having a green color filter. This phenomenon is called optical crosstalk. Electrical crosstalk and optical crosstalk are collectively called inter-pixel crosstalk. Inter-pixel crosstalk may cause a color tone defect or image quality deterioration in the CMOS image sensor.

In the image sensor described in Japanese Unexamined Patent Publication No. 2006-279048, in particular an upper substrate region located under a pixel with a long wavelength red color filter is electrically insulated from an adjacent pixel with a green color filter and extends more outward than the red pixel in a plan view. The electric charge which has been generated from the light passing through the red color filter and has arrived at the upper substrate region and is collected in the red pixel without entering the green pixel, even if it flows to the outside of the red pixel. Electrical crosstalk is thus prevented.

However, even when the above technique is used, there remains a possibility that inter-pixel crosstalk, in particular optical crosstalk, occurs. With this background, Japanese Unexamined Patent Publication No. 2007-227761 and Japanese Unexamined Patent Publication No. 2008-10544 disclose image sensors (solid-state image sensors) in which neighboring unit pixels are electrically insulated from each other by an isolation insulating film inside which an airspace called an air gap is formed. Also, Japanese Unexamined Patent Publication No. 2009-267208 discloses a flash memory in which an air gap is formed in an isolation insulating film between neighboring cells. Also, Japanese Unexamined Patent Publication No. 2002-203896 discloses a method for manufacturing a shallow trench structure with an air gap.

SUMMARY

However, in both the solid-state image sensors disclosed in Japanese Unexamined Patent Publication No. 2007-227761 and Japanese Unexamined Patent Publication No. 2008-10544, the lowest part of the air gap (part nearest to the bottom) is located above the lowest part of the photodiode. For this reason, the air gap does not exist around the lower part of the photodiode in a plan view. Therefore, the air gap may not adequately function to prevent optical crosstalk in the lower part of the photodiode. Furthermore, the lowest part of the air gap disclosed in Japanese Unexamined Patent Publication No. 2009-267208 is in a much higher (shallower) position than the lowest part of the device isolation trench. Therefore, the air gap described in Japanese Unexamined Patent Publication No. 2009-267208 also has the same problem as the air gaps disclosed in Japanese Unexamined Patent Publications 2007-227761 and 2008-10544. It is difficult to solve the above problem using the manufacturing method disclosed in Japanese Unexamined Patent Publication No. 2002-203896.

The present invention has been made in view of the above problem. An object thereof is to provide a semiconductor device having a solid-state image sensor which can prevent inter-pixel crosstalk more reliably.

According to one aspect of the present invention, there is provided a semiconductor device which is configured as follows. The semiconductor device includes: a semiconductor substrate having a main surface; a first conductivity type impurity layer located over the main surface of the semiconductor substrate; a photoelectric transducer including a first conductivity type impurity region and a second conductivity type impurity region which are joined to each other over the first conductivity type impurity layer; and transistors which configure a unit pixel including the photoelectric transducer and are electrically coupled to the photoelectric transducer. At least part of the area around the photoelectric transducer in a plan view contains an air gap and also has an isolation insulating layer for electrically insulating the photoelectric transducer and a photoelectric transducer adjacent to it from each other. The isolation insulating layer abuts on the top surface of the first conductivity type impurity layer.

According to the present invention, the isolation insulating layer located around the photoelectric transducer, extending down to the top surface of the first conductivity type impurity layer, prevents electrical crosstalk between neighboring photoelectric transducers. Also the air gap inside the isolation insulating layer prevents optical crosstalk between neighboring photoelectric transducers.

DETAILED DESCRIPTION

Next, the preferred embodiments of the present invention will be described referring to the accompanying drawings.

First Embodiment

First, a semiconductor device as a chip according to this embodiment will be described.

Figure 1:
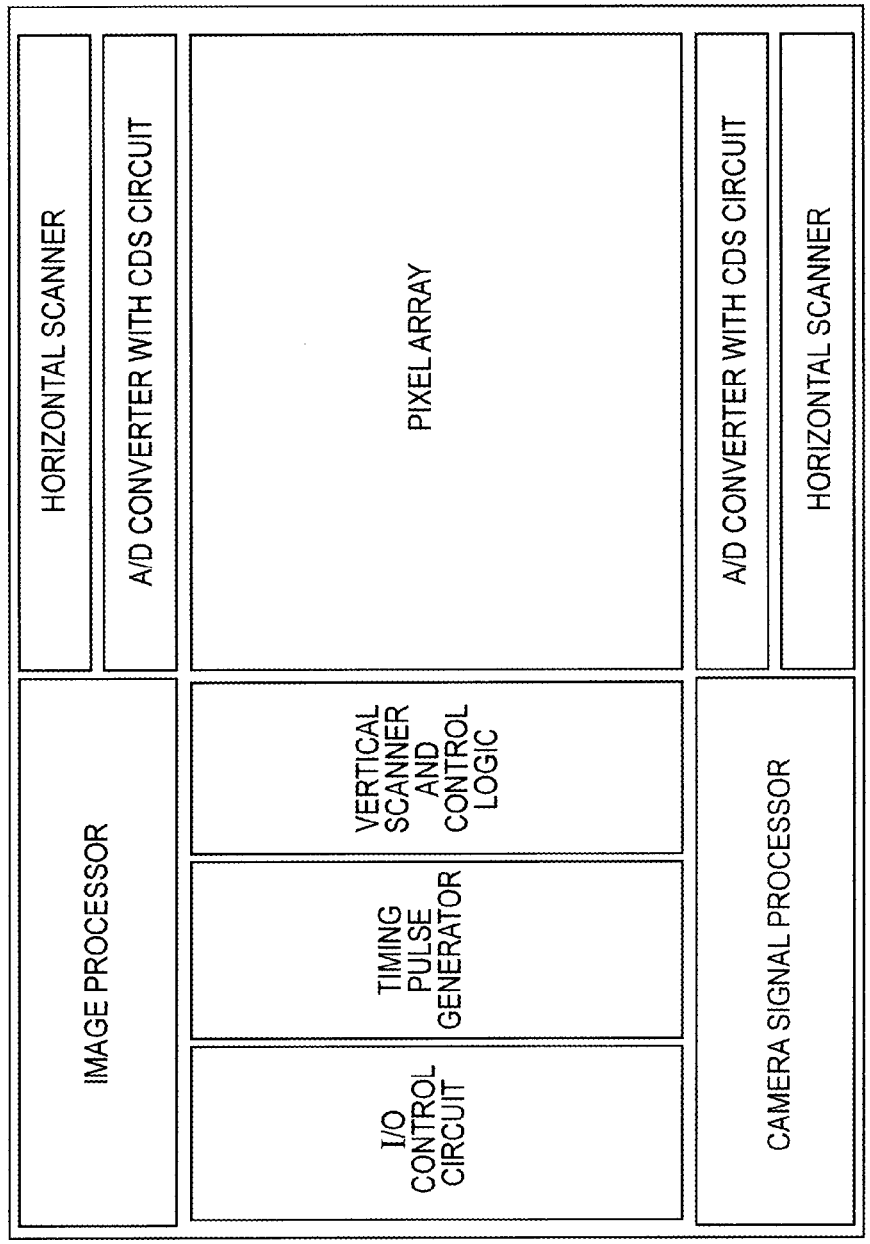
FIG. 1 is a schematic plan view of a system chip including a CMOS image sensor as a semiconductor device according to a first embodiment of the present invention.

Referring to FIG. 1, the semiconductor chip CHP formed by dicing a semiconductor wafer is, for example, rectangular in planar shape. A pixel array in which a CMOS image sensor is formed is disposed over the main surface of the semiconductor chip CHP. The CMOS image sensor converts received light into electrons and outputs a voltage depending on the number of generated electrons. Various blocks including an I/O control circuit, horizontal scanner, vertical scanner and control logic, A/D converter with a CDS circuit, image processor, camera signal processor, and timing pulse generator are disposed around the pixel array.

The I/O control circuit is a circuit which controls signals which come from, and go to, an external device (circuit) coupled with the chip CHP. The horizontal scanner and vertical scanner make a selection among a plurality of unit pixels of the CMOS image sensor disposed in the pixel array and detect whether or not a selected pixel receives light. This operation is controlled by the control logic of the vertical scanner.

The A/D converter converts a voltage signal as an analog signal generated from a unit pixel into a digital signal. The CDS circuit, which is attached to the A/D converter, measures an electric signal from a single unit pixel twice and cancels noise as the difference between the two measured signals. The CDS circuit is a circuit which is based on the CDS (Correlated Double Sampling) method and intended to remove amplifier noise and reset noise. The image processor corrects and processes the image created by processing generated voltage signals. The camera signal processor processes signals which represent operation of the camera. The timing pulse generator generates timing pulses as signals to synchronize the various blocks of the chip CHP.

Figure 2:
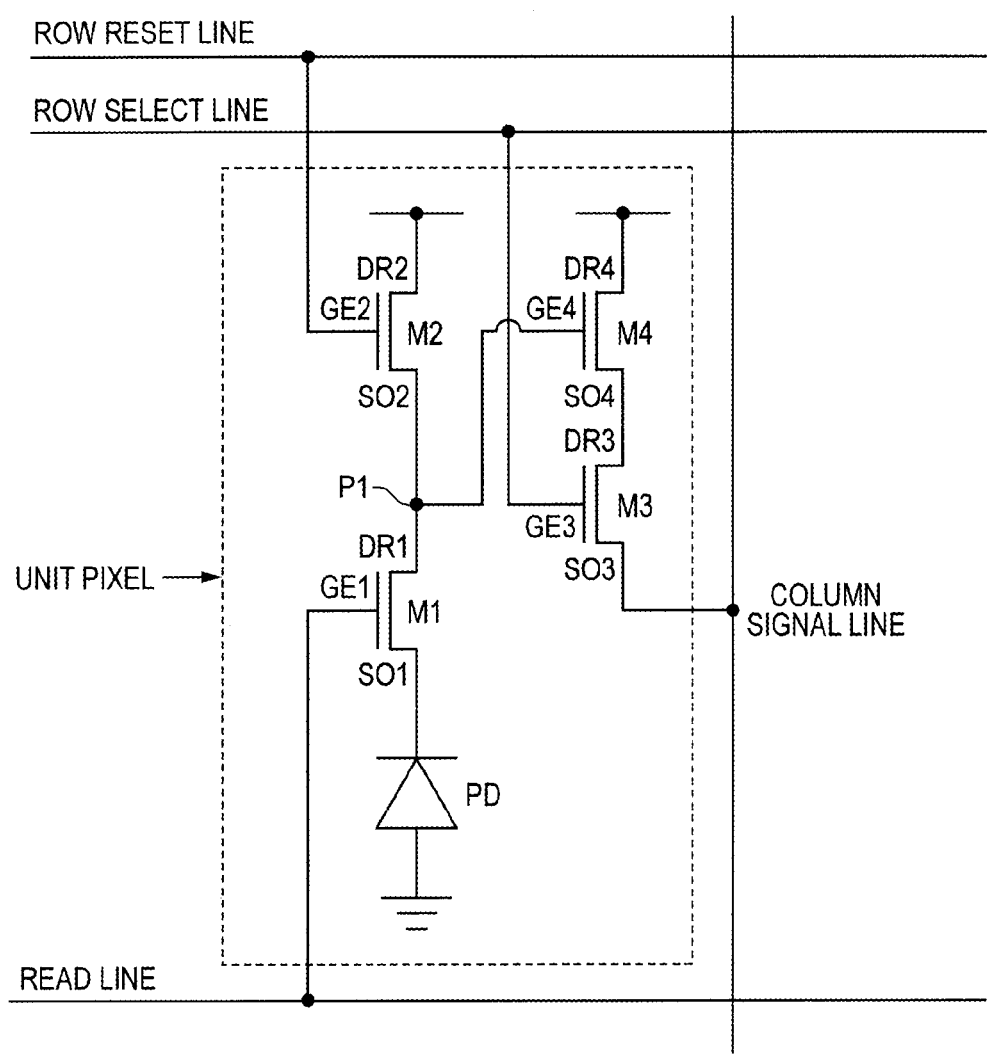
FIG. 2 is an equivalent circuit diagram of a unit pixel configuring a CMOS image sensor.

Next, the configuration and operation principle of each unit pixel will be described referring to FIG. 2. Referring to FIG. 2, each unit pixel which configures the CMOS image sensor includes a photodiode PD (photoelectric transducer), transfer transistor M1, reset transistor M2, select transistor M3, and amplification transistor M4, in which these transistors M1 to M4 are electrically coupled with each other. The transistors M1 to M4 are each, for example, a MOS (Metal Oxide Semiconductor) transistor and the source region SO1 of the transistor M1 is coupled to the photodiode PD and its gate electrode GE1 is coupled to a read line. The source region SO2 of the transistor M2 is coupled to the drain region DR1 of the transistor M1 and its gate electrode GE2 is coupled to a row reset line. The source region S03 of the transistor M3 is coupled to a column signal line and its gate electrode GE3 is coupled to a row select line. The source region SO4 of the transistor M4 is coupled to the drain region DR3 of the transistor M3 and its gate electrode GE4 is coupled to the drain region DR1 and source region SO2.

The photodiode PD absorbs external light, generates, by photoelectric conversion, electrons the amount of which depends on the amount of the light, and stores the electrons in it, thereby producing an electric signal (voltage). This electric signal is transferred by the transfer transistor M1 which is turned on by a signal from the read line, and reaches a junction point P1. The charge generated at the photodiode PD is stored at the junction point P1. The voltage signal corresponding to the charge at the junction point P1 controls the gate electrode GE4 of the amplification transistor M4.

The voltage whose level depends on the voltage signal (the amount of charge at the junction point P1) received by the amplification transistor M4 from the photodiode PD is sent from the select transistor M3 coupled to the amplification transistor M4 (through the source region SO4 and drain region DR3) to the column signal line. Specifically, when the select transistor M3 is turned on by an electric signal from the row select line, the column signal line reads the level of the voltage in the unit pixel concerned. Basically a plurality of unit pixels in a column which are coupled to the row select line are selected simultaneously.

The reset transistor M2 periodically resets the charge stored in the drain (junction point P1) of the transfer transistor M1 by applying a voltage to the row reset line to turn it on. As a result of this resetting operation, the charge stored in the transfer transistor M1 is lost so that the unit pixel is initialized. At this time, a given voltage is applied to the drain region DR2 and the drain region DR4.

Next, the structure of each of the unit pixels which are disposed in the pixel array in this embodiment will be described referring to FIGS. 3 to 8.

Figure 3:
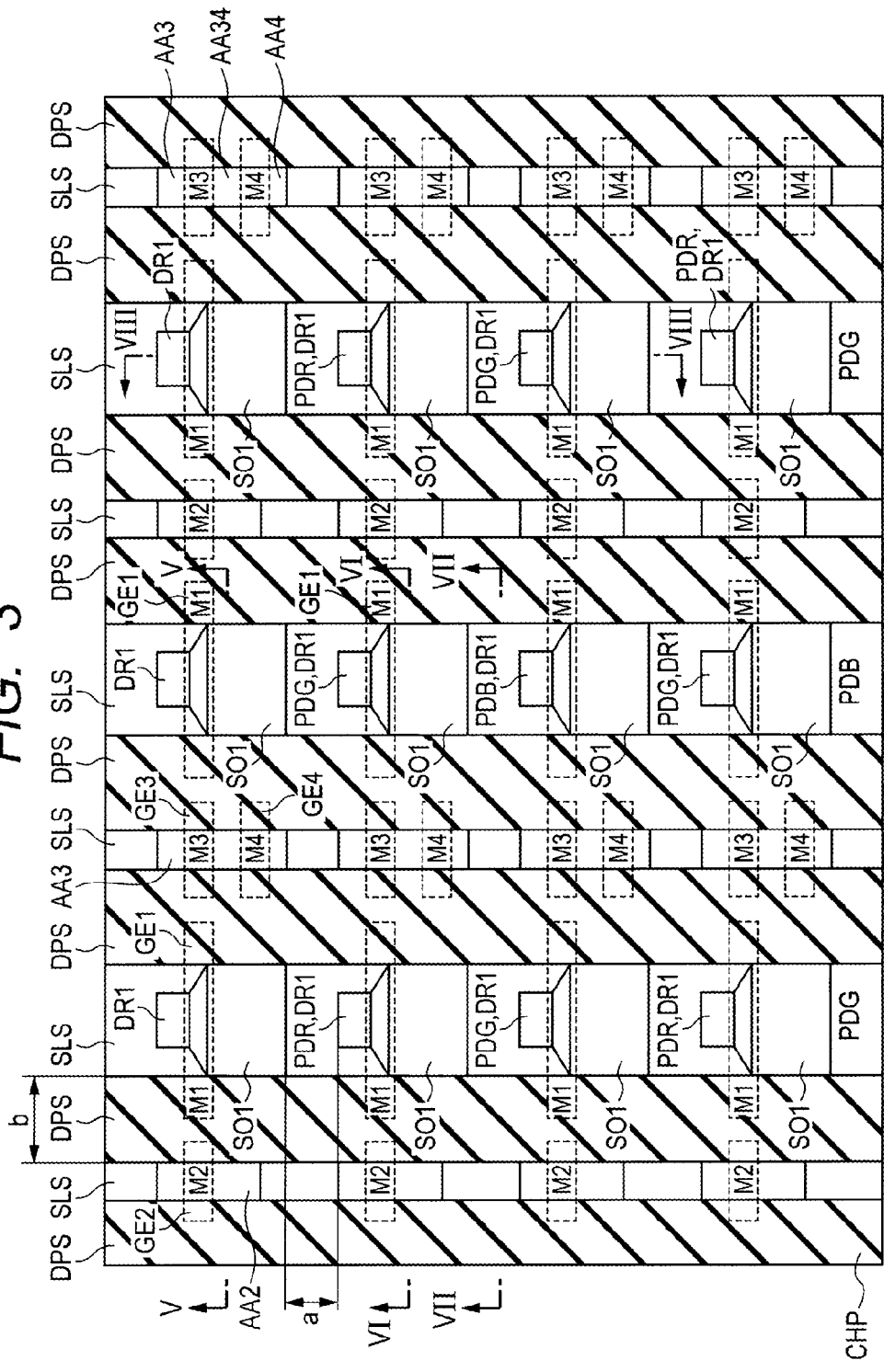
FIG. 3 is a schematic plan view showing the arrangement of a plurality of unit pixels in a pixel array according to the first embodiment.

Referring to FIG. 3, a plurality of transistors M1 to M4 as shown in FIG. 2 are arranged in a matrix pattern over the main surface of a semiconductor chip CHP (semiconductor substrate which will be described later) and spaced from one another in a plan view. Basically, one unit pixel includes all of the transistors M1 to M4. However, two neighboring transistors M1 may share transistors M2, M3, and M4 as shown in FIG. 3.

Transistors M1, each having a photodiode PDR, PDG, or PDB, are alternately arranged. The photodiode PDR is a photoelectric transducer which has a red color filter. The light which the photodiode PDR receives is red light which passes through the red color filter. Likewise, the photodiodes PDG and PDB are photoelectric transducers which have a green color filter and a blue color filter and can receive green light and blue light respectively.

It is preferable that the photodiodes PDR and PDB should be both located adjacent to the photodiodes PDG (in the vertical and horizontal directions of the figure). More specifically, for example, in the uppermost line in FIG. 3 in which photodiodes line up in the horizontal direction, a photodiode PDG is adjacently located on the right of a photodiode PDR (left) and a photodiode PDR is adjacently located on the right of the photodiode PDG. In the second uppermost line in FIG. 3 in which photodiodes line up in the horizontal direction, a photodiode PDB is adjacently located on the right of a photodiode PDG (left) and a photodiode PDG is adjacently located on the right of the photodiode PDB. In the left line among the three vertical lines of photodiodes in FIG. 3, photodiodes PDR and PDG are alternately arranged. In the center line among the three vertical lines of photodiodes, photodiodes PDG and PDB are alternately arranged.

Figure 4:
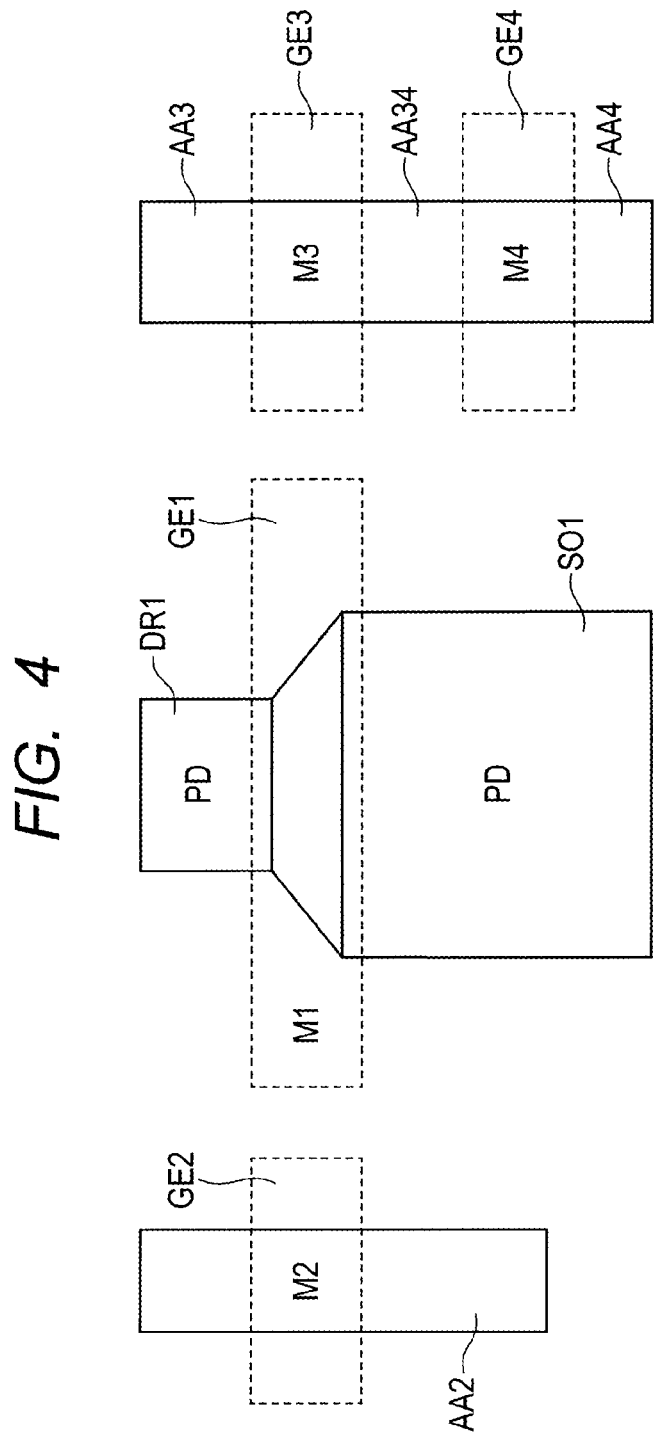
FIG. 4 shows various transistors shown in FIG. 3 in enlarged form.

Referring to FIGS. 3 and 4, the source region SO1 is part (first impurity region) of the active region (first active region) of a transfer transistor M1 (first transistor) which includes a photodiode PD. The drain region DR1 is part of the active region (first active region) of the transfer transistor M1 which is formed as a floating diffusion region FD (second impurity region as an impurity diffusion layer). In other words, the transfer transistor M1 is formed in the first active region which includes the photodiode PD (source region SO1) and floating diffusion region FD (drain region DR1).

Generally, the source region SO1 including the photodiode PD is larger than the drain region DR1 including the floating diffusion region DR1 in a plan view. For this reason, the channel region between the source region SO1 and drain region DR1 is virtually trapezoidal.

The floating diffusion region FD has a parasitic capacitance. Therefore, when the charge generated from the photodiode PD is transferred to the drain region DR1 (junction point P1 in FIG. 2), the drain region DR1 (junction point P1) receives and stores the charge.

In the transfer transistor M1, the active region extends perpendicularly (in the vertical direction of the figures) to the gate electrode GE1 extending in the horizontal direction of the figures. The source region SO1 and drain region DR1 lie in the active region of the transfer transistor M1. In other words, the gate electrode GE1 is located in the center and the source region SO1 and drain region DR1 are located on both sides thereof.

The active regions AA2, AA3, and AA4 (second active regions) extend in the vertical direction or perpendicularly to the horizontal direction in which the gate electrodes GE2, GE3, and GE4 extend. The active regions AA2, AA3, and AA4 include the source regions and drain regions of the transistors M2 to M4 (second transistors). In other words, the transistors M2 to M4 are formed in the second active regions. However, since the drain region DR3 of the transistor M3 and the source region SO4 of the transistor M4 are coupled with each other, they are shown as a common active region AA34 in the figures.

In the plan view of FIG. 3, the wires for coupling the transistors M1 to M4 of the unit pixels which are shown in the equivalent circuit in FIG. 2 are omitted.

In order to isolate the transistors M1 to M4 electrically, electrical isolation layers lie between the transistors in a plan view. This means that the different transistors are electrically insulated from one another in the regions (not shown in FIG. 3) other than the wires for coupling the transistors M1 to M4 of each unit pixel are located.

The electrical isolation layers include shallow isolation regions SLS and deep isolation regions DPS. Regarding the electrical isolation layers shown in FIG. 3, shallow isolation regions SLS are provided in regions where neighboring transistors M1 are linearly coupled in the vertical direction of FIG. 3 and deep isolation regions DPS are provided in the other regions for linear coupling in the vertical direction.

For the active region of a particular transistor M1, the nearest one among the active regions (of the other transistors) is the active region of another transistor vertically adjacent to the particular transistor M1 as shown in FIG. 3. For example, the other active region nearest to the active region of the transistor M1 including the photodiode PDR located in the leftmost and uppermost place in FIG. 3 is the transistor M1 located under and adjacent to the particular transistor M1. The shortest distance between the active regions of the above pair of transistors M1 (of the neighboring pixels) is the shortest distance a between the source region SO1 of the upper transistor M1 and the drain region DR1 of the lower transistor M1. The value a is smaller than the shortest distance b between the active region of the transistor M1 including the photodiode PDR located in the leftmost and uppermost place in FIG. 3 and the active regions of the transistors M3 and M4 (of the same unit pixel) adjacent to and on the right of the transistor M1 in question (conversely, the shortest distance b is larger than the shortest distance a). Similarly, the shortest distance between the active region of the transistor M1 including the photodiode PDR located in the leftmost and uppermost place in FIG. 3 and the active region of the transistor M2 adjacent to and on the left of the transistor M1 is equal to the distance b and is larger than the shortest distance a. In this embodiment, an electrical isolation layer as a shallow isolation region SLS lies in the region between the active region of a particular transistor M1 and the active region of the transistor nearest to it in a plan view with the shortest distance a between them. On the other hand, an electrical isolation layer as a deep isolation region DPS lies in the region between the active region of a particular transistor M1 and the active region of the transistor M3 or the like (adjacent to the transistor M1) with the shortest distance b to the active region of the transistor M1. Similarly, an electrical isolation layer as a deep isolation region DPS also lies in the region between the active region of a particular transistor M1 and the active region of the transistor M2 adjacent to the active region of the transistor M1.

Specifically, a shallow isolation region SLS lies in the region between a pair of neighboring transistors M1 (in particular the region between the source region 501 (photodiode) of one of the transistors M1 as a pair and the drain region DR1 of the other transistor M1 nearest to it in a plan view). More specifically, a shallow isolation region SLS is formed in the region between the active region of one transistor M1 shown in FIG. 3 and the active region of the other transistor M1 adjacent to it (in the vertical direction of the figure), among the regions where transistors M1 to M4 are not located in a plan view.

A deep isolation region DPS lies in a region among the regions where transistors M1 to M4 are not located in a plan view (regions between transistors) which is other than the regions where shallow isolation regions SLS lie. In other words, a deep isolation region DPS is formed in particular in the region between the active region of a transistor M1 in FIG. 3 and the active regions of transistors M2 to M4 adjacent to it in a plan view (in the horizontal direction of the figure), among the regions where transistors M1 to M4 are not located. This is described below in more detail referring to FIGS. 5 to 8.

Referring to FIGS. 5 to 8, elements which configure the semiconductor chip CHP are formed over the main surface of a semiconductor substrate SUB. The semiconductor substrate SUB is made of, for example, single-crystalline silicon. The conductivity type of the semiconductor substrate SUB may be either the n-type or p-type. The explanation below assumes that the semiconductor substrate SUB is of the $n^-$ type.

For example, a $p^-$ type semiconductor layer DPW (first conductivity type impurity layer) lies over the main surface of the semiconductor substrate SUB. For each unit pixel, for example, a $p^-$ type well region WL is located over the main surface above the semiconductor layer DPW. More specifically, the semiconductor layer DPW is part of a well region which is formed deeper (downward in the figures) than the well region WL. The well region WL is formed so that its lowest part abuts on the top surface of the semiconductor layer DPW. Therefore, the semiconductor layer DPW forms a potential barrier which prevents the electrons generated by photoelectric conversion inside the photodiode of each unit pixel from moving toward the substrate SUB (downward in FIGS. 5 to 8). The semiconductor layer DPW which functions as the potential barrier improves the sensitivity with which each unit pixel generates electrons.

A plurality of photodiodes PDR, PDG, and PDB (photoelectric transducers) are arranged and spaced from one another inside the well region WL. A transfer transistor M1 is formed in which a photodiode PDR, PDG, or PDB is a source region SO1 and a floating diffusion region FD (see FIG. 4) is a drain region DR1. For example, the photodiodes PDR, PDG, and PDB are each configured so that a $p^{++}$ type high-doped region PPR (first conductivity type impurity region) lies over an $n^+$ type impurity region (second conductivity type impurity region) and the regions are joined together. As the joint between the $n^+$ type impurity region and the high-doped region PPR receives light, photoelectric conversion occurs depending on the amount of received light, thereby generating charge such as electrons in the vicinity of the joint.

The $p^{++}$ type high-doped region PPR of the photodiode is intended to prevent the defective electrons generated in the vicinity of the top surface of the laminated structure shown in FIGS. 5 to 8 from arriving at the $n^+$ layer of the photodiode, resulting in a noise current called a dark current. The $n^+$ layer of the photodiode collects and accumulates electrons generated by photoelectric conversion.

As mentioned above, the electrical isolation layers which electrically insulate the transistors M1 to M4 have deep isolation regions DPS and shallow isolation regions SLS. Each deep isolation region DPS is configured as follows: an air gap AG is formed therein and an isolation insulating layer SI, for example, as a silicon oxide film, extends deep enough to abut on the top surface of the deep well region DPW, in the same layer as the photodiode (transistor). More specifically, the isolation insulating layer SI extends from the top surface (except the gate electrode GE1 and gate insulating film GI) of the laminated structure over the main surface of the semiconductor substrate SUB deep enough to abut on the top surface of the semiconductor layer DPW. The isolation insulating layer SI may be produced by the so-called LOCOS (Local Oxidation of Silicon) technique or so-called STI (Shallow Trench Isolation) technique.

The side face of the isolation insulating layer SI is covered, for example, by a $p^+$ type impurity region SPR (thin impurity film of the first conductivity type). The impurity region SPR is intended to prevent the defective electrons generated in the vicinity of the interface between the semiconductor layer DPW and well region WL from arriving at the $n^+$ layer of the photodiode, resulting in a dark current.

For example, the air gap AG here means a condition that air fills the inside of the isolation insulating layer SI. The lowest part of the air gap AG (namely the part of the air gap which is nearest to the semiconductor substrate SUB) is located in a position deeper than the lowest part of the photodiode (namely the lowest part of the $n^+$ type region SO1 (PDR, PDG, or PDB) of the photodiode). In other words, the lowest part of the air gap AG is nearer to the semiconductor substrate SUB (downward in FIGS. 5 to 7) than the lowest part of the photodiode ($n^+$ type region SO1).

Figure 7:
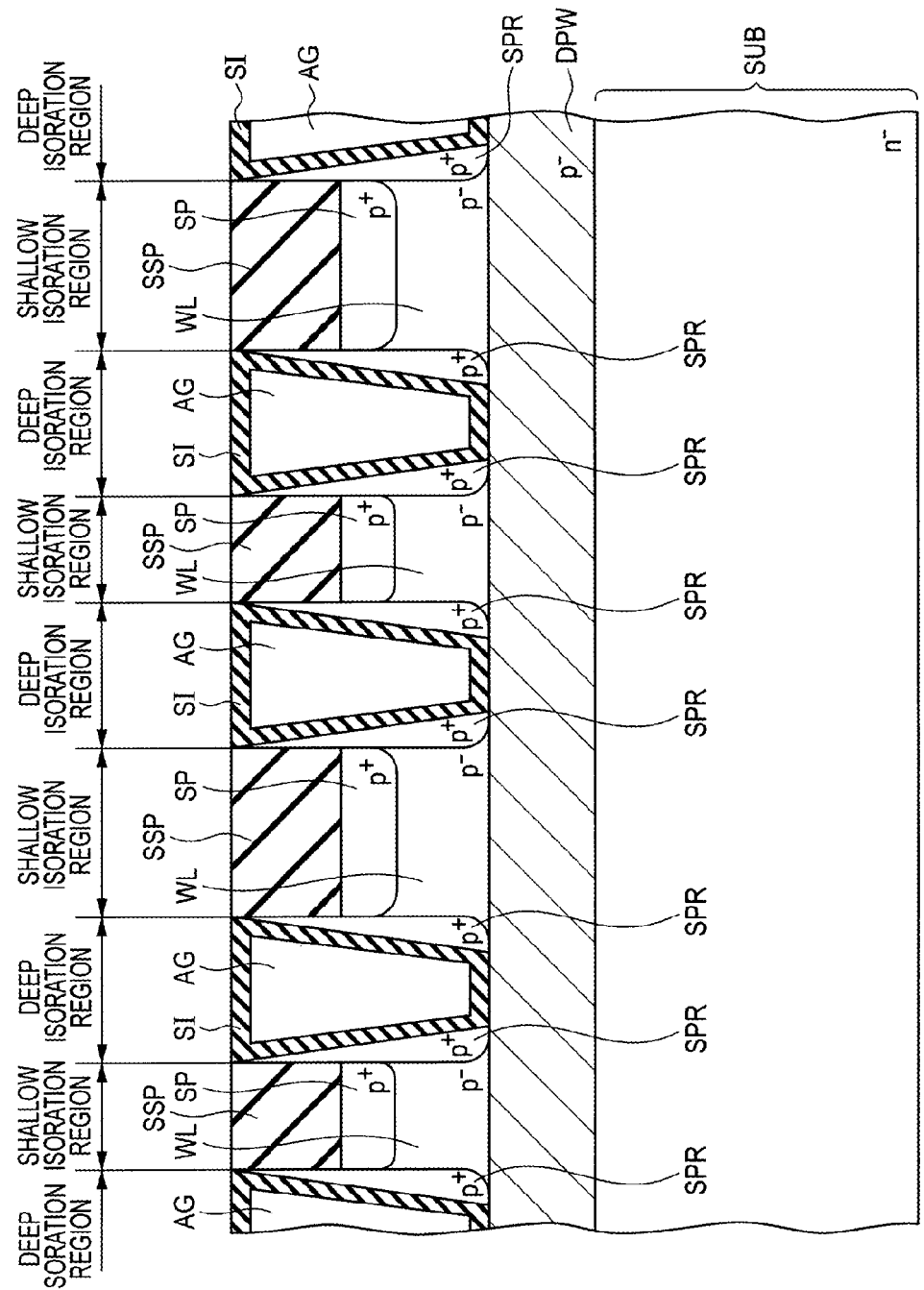
FIG. 7 is a schematic sectional view taken along the line VII-VII of FIG. 3.
Figure 8:
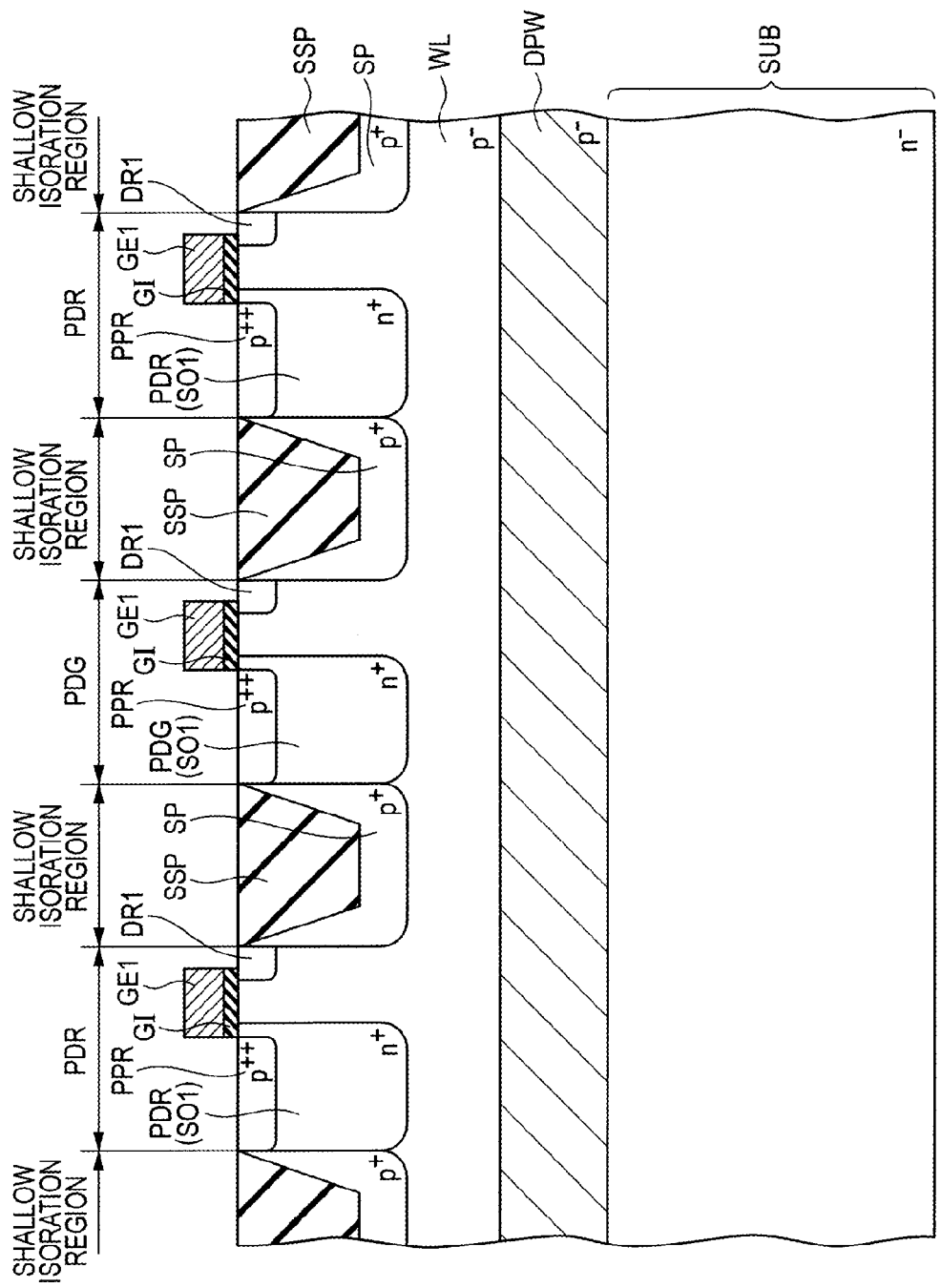
FIG. 8 is a schematic sectional view taken along the line VIII-VIII of FIG. 3.

On the other hand, referring to FIGS. 7 and 8, the shallow isolation region SLS is a laminated structure in which an insulating layer SSP (element isolation layer), for example, as a silicon oxide film and a $p^+$ type region SP under it are stacked. The lowest part of the shallow isolation region SLS extends down to a level shallower than the top surface of the deep well region DPW without reaching the top surface. In other words, the shallow isolation region SLS is formed so as to be less deep than the isolation insulating layer SI and not abut on the semiconductor layer DPW. The shallow isolation region SLS (element isolation layer), a laminated structure comprised of the $p^+$ type region SP and insulating layer SSP, prevents inter-pixel crosstalk between neighboring photodiodes.

Figure 9:
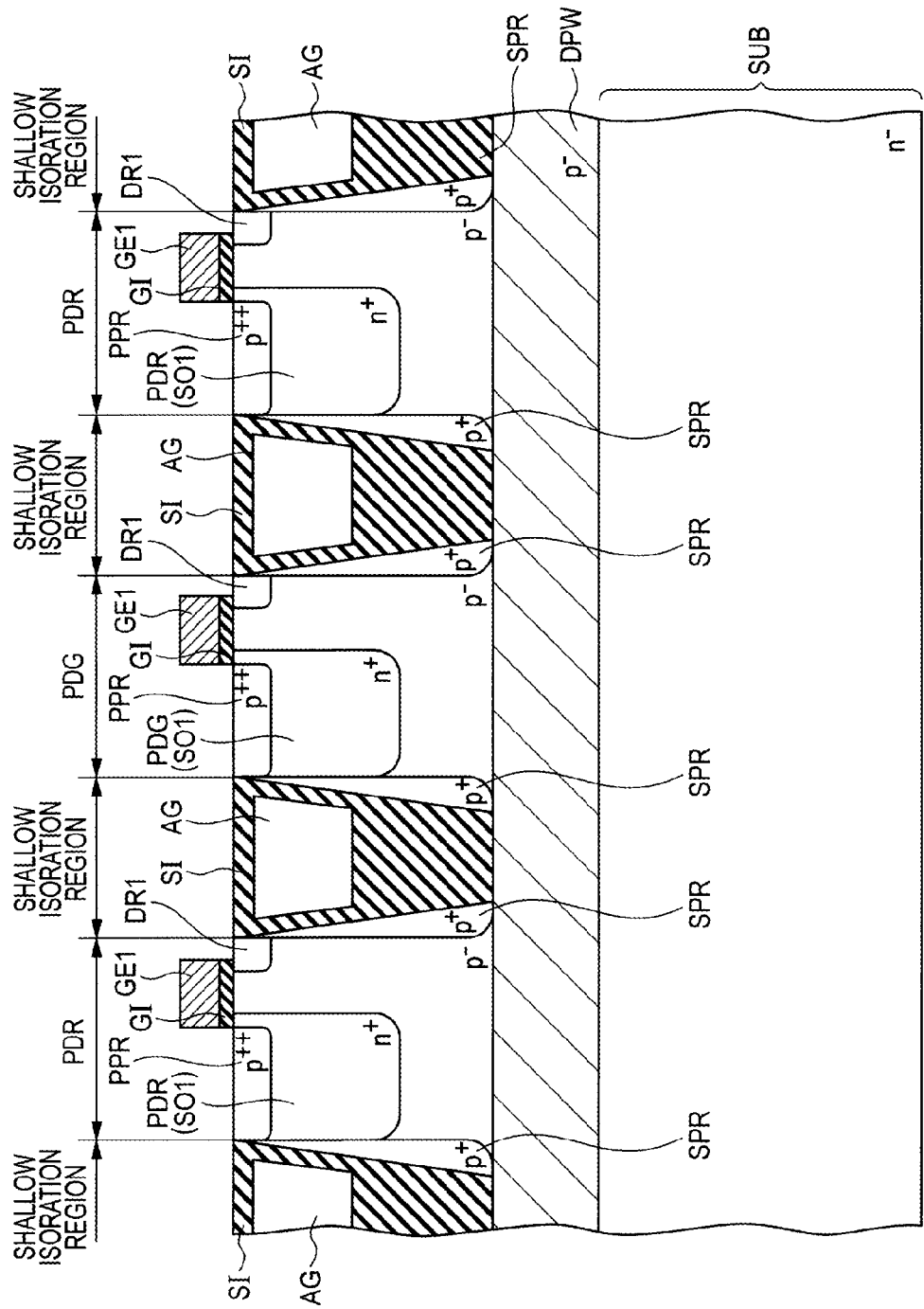
FIG. 9 is a schematic sectional view showing a variation of the shallow isolation region shown in FIG. 8 in the first embodiment.

Referring to FIG. 9, the shallow isolation region SLS may be an isolation insulating layer SI instead of the laminated structure comprised of the insulating layer SSP and $p^+$ type region SP as shown in FIG. 8. The structure shown in FIG. 9 is the same as that shown in FIG. 8 except the shallow isolation region SLS structure as mentioned above.

Figure 5:
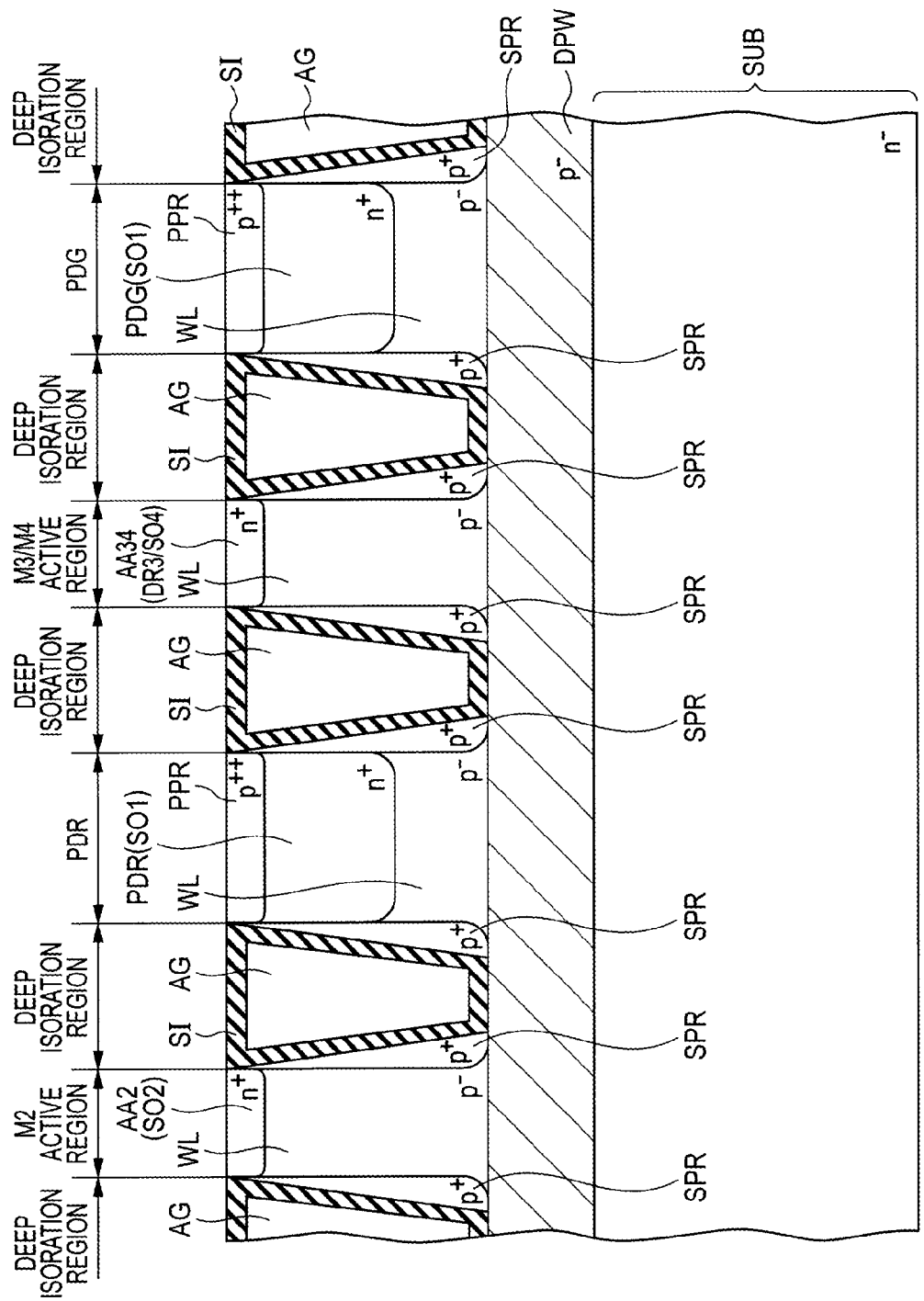
FIG. 5 is a schematic sectional view taken along the line V-V of FIG. 3.
Figure 6:
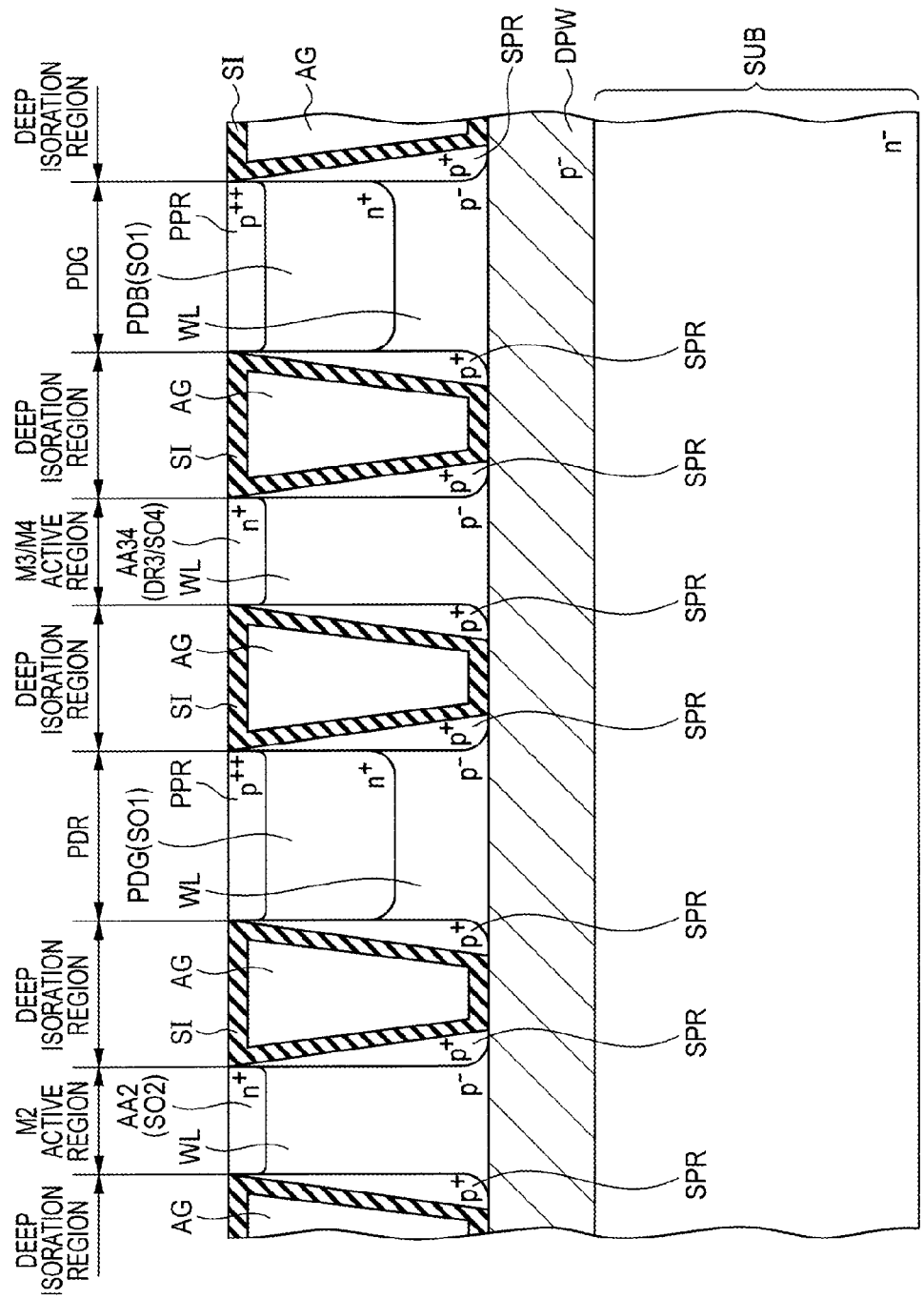
FIG. 6 is a schematic sectional view taken along the line VI-VI of FIG. 3.

The isolation insulating layer SI as the shallow isolation region SLS in FIG. 9 is different from the isolation insulating layer SI as the deep isolation region DPS shown in FIGS. 5 to 7 in that the lowest part of its air gap AG is in a position shallower than the lowest part of the photodiode (upward in FIG. 9). However, the isolation insulating layer SI shown in FIG. 9 also extends deep enough for its lowest part to reach and abut on the top surface of the deep well region DPW.

As will be mentioned later, in the first embodiment, the air gap AG of the isolation insulating layer SI as a deep isolation region DPS which extends in the vertical direction of FIG. 3 may extend in the vertical direction of FIG. 3 (along the main surface of the semiconductor substrate SUB) so as to couple the areas around plural transistors M1.

Next, the effect of this embodiment will be described referring to the comparative example shown in FIGS. 10 and 11.

Figure 10:
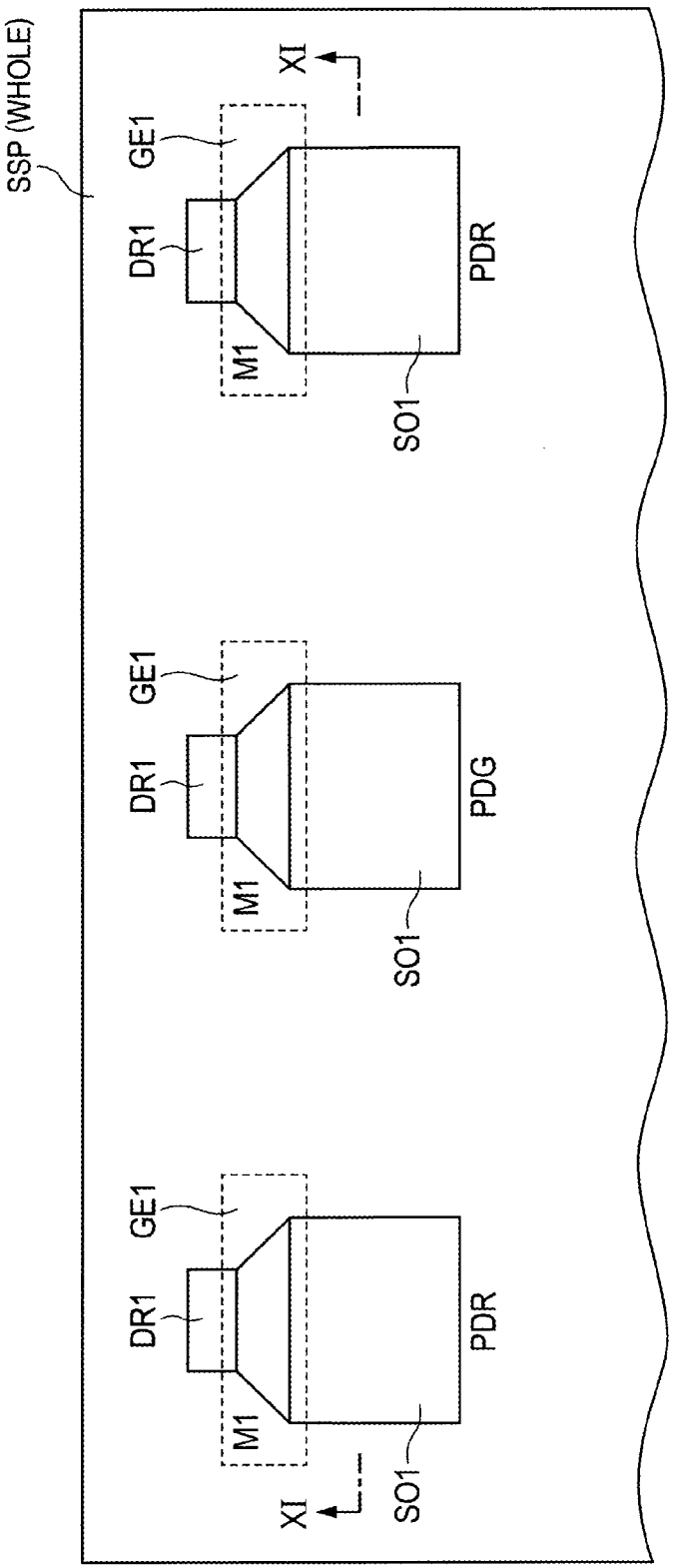
FIG. 10 is a schematic plan view showing the arrangement of a plurality of unit pixels in a pixel array as a comparative example for the first embodiment.
Figure 11:
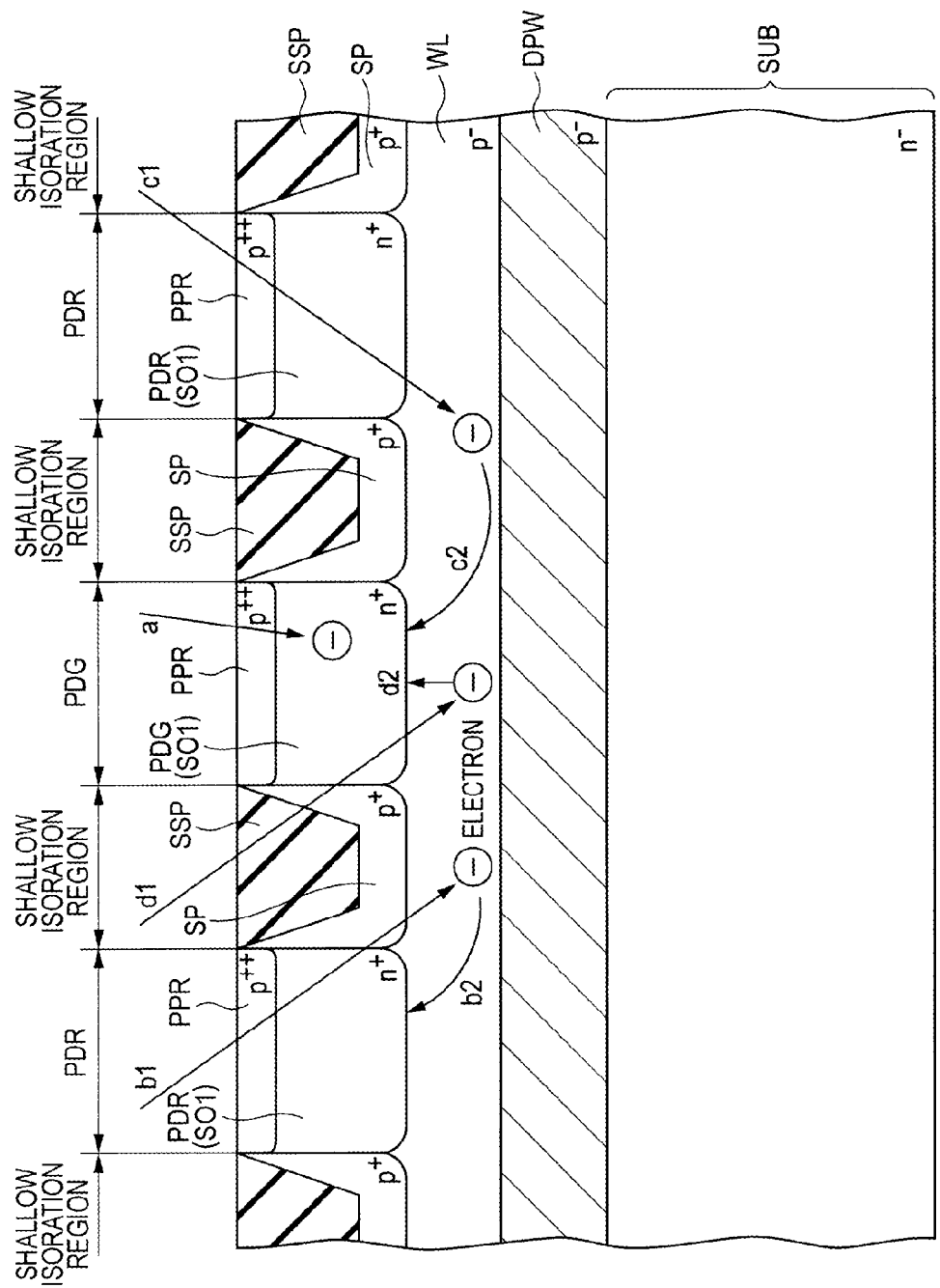
FIG. 11 is a schematic sectional view taken along the line XI-XI of FIG. 10.

Referring to FIGS. 10 and 11, in the example to be compared against this embodiment, almost all the isolation regions where transistors M1 to M4 are not formed in a plan view are shallow isolation regions as shown in FIG. 8. In this comparative example, the shallow isolation region has a laminated structure which includes an insulating layer SSP and a $p^+$ type region SP as shown in FIG. 8. In other words, the shallow isolation regions of the pixel array of this comparative example, which are intended to insulate neighboring elements electrically, do not reach the semiconductor layer DPW.

Referring to FIG. 11, a light ray a which enters, for example, a photodiode PDG having a green color filter is normally converted into electrons by photoelectric conversion inside the green photodiode PDG.

On the other hand, light rays b1 and c1 which enter, for example, a photodiode PDR having a red color filter become red light rays which have a longer wavelength and get into the silicon deeper. The red light rays induce photoelectric conversion, for example, inside the well region WL at the bottom of the laminated structure (downward in FIG. 11), generating charge (electrons). The electrons generated by photoelectric conversion of the red light ray b1 move toward the direction b2 of FIG. 11 by diffusion or drifting and are correctly collected and accumulated in the $n^+$ layer PDR of the red photodiode PDR. On the other hand, the electrons generated by photoelectric conversion of the red light ray c1 get into the shallow isolation region (under the $p^+$ layer SP) between the red photodiode and green photodiode by diffusion or drifting. As a consequence, the electrons move toward the direction c2 of FIG. 11. This means that although the light ray c1 has passed through the red color filter, it is wrongly collected in the $n^+$ layer PDG of the green photodiode PDG, causing electrical crosstalk.

Or a light ray d1 about to enter the red photodiode may pass through the insulating layer SSP of the shallow isolation region shown in FIG. 11 and be wrongly collected in the layer PDG of the adjacent green photodiode PDG, resulting in optical crosstalk. Since the insulating layer SSP and $p^+$ region SP have no air gap AG, the difference in optical refraction index between the silicon of the photodiode and the insulating layer SSP is small. For this reason, total reflection of light hardly occurs in the boundary between the silicon and insulating layer SSP. Therefore, particularly light with a long wavelength such as red light may cause optical crosstalk since it can easily pass through the insulating layer SSP and get into an adjacent photodiode.

If such crosstalk (inter-pixel crosstalk) occurs, the image created in the CMOS image sensor by such light rays may have a color tone defect, resulting in deterioration of the quality of the created image.

As mentioned above, although the shallow isolation region SLS which includes the insulating layer SSP has an effect which prevents inter-pixel crosstalk, the effect may be insufficient and cause inter-pixel crosstalk.

As a solution, it is preferable as in this embodiment that a deep isolation region which is deep enough to reach the semiconductor layer DPW should be provided, for example, between neighboring (different color) photodiodes. This will reduce the possibility that the electrons generated by photoelectric conversion, for example, in a pixel with a red photodiode get into the area under the deep isolation region and wrongly enter an adjacent pixel with a green photodiode. This is because the semiconductor layer DPW, which abuts on the deep isolation region SI, functions as a potential barrier to deter penetration of the electrons. Therefore, according to this embodiment, electrical crosstalk between neighboring (different color) photodiodes can be prevented.

Furthermore, when the lowest part of the air gap AG is in a position deeper than the lowest part of the photodiode as in this embodiment, the light which has entered the air gap AG is very likely to be reflected. This is because total reflection of light in the air gap AG is more likely to occur due to the difference between the optical refraction index of the air in the air gap AG and the optical refraction index inside the semiconductor laminated structure. This reduces the possibility that light which has entered, for example, the red photodiode passes through the air gap AG and wrongly enters the green photodiode. In other words, since the air gap AG extends deep enough, it prevents optical crosstalk between neighboring (different color) photodiodes more effectively.

However, an isolation insulating layer SI having an air gap AG whose lowest part is in a position shallower than the lowest part of the photodiodes as shown in FIG. 9 may be used for a deep isolation region DPS. The isolation insulating layer SI shown in FIG. 9 is so formed that its lowest part abuts on the top surface of the semiconductor layer DPW or it extends deep enough to reach the semiconductor layer DPW. Therefore, the isolation insulating layer SI at least prevents electrical crosstalk between neighboring photodiodes although the lowest part of its air gap AG is in a position shallower than the lowest part of the photodiodes. Also since the isolation insulating layer SI has the air gap AG, it is more effective in reflecting light and preventing optical crosstalk than the structure of the shallow region SLS shown in FIG. 8.

In this embodiment, it is preferable that a shallow isolation region SLS should be formed in a region where the distance a is relatively short in a plan view (a<b), such as between a pair of neighboring transistors M1 as shown in FIG. 3. Also, it is preferable that a deep isolation region DPS should be formed in a region where the distance b is relatively long in a plan view (b>a), such as between a transistor M1 and a transistor M2 adjacent to it as shown in FIG. 3.

It is easy to form a deep isolation insulating layer SI having a relatively deep air gap AG in a deep isolation region DPS in a situation that the aspect ratio of the width of the region (in a plan view) to the depth of the isolation insulating layer SI is relatively small. In other words, it is relatively easy to form an isolation insulating layer SI in a region with a relatively large width like the region having the distance b. However, it is difficult to form an isolation insulating layer SI in a region with a relatively small width like the region having the distance a, because the width-depth aspect ratio is relatively large. The reason is that as the larger the aspect ratio is, the more difficult it is to create a deep air gap AG.

Therefore, by forming an isolation insulating layer SI only in a region where a deep isolation insulating layer SI can be formed relatively easily as in this embodiment, inter-pixel crosstalk can be prevented more reliably in the region where the deep isolation insulating layer SI is formed. This prevents image quality deterioration due to color tone defects in pixels.

In addition, shallow isolation regions are formed in other regions, which means that the width of these regions (for example, distance a in FIG. 3) can be smaller, so pixels can be arranged more densely.

As discussed so far, in this embodiment, both electrical crosstalk and optical crosstalk can be prevented more effectively and inter-pixel crosstalk can be prevented more reliably.

Next, a method for manufacturing an isolation insulating layer SI for STI having an air gap AG in a deep isolation region DPS will be described referring to FIGS. 12 to 17.

Figure 12:
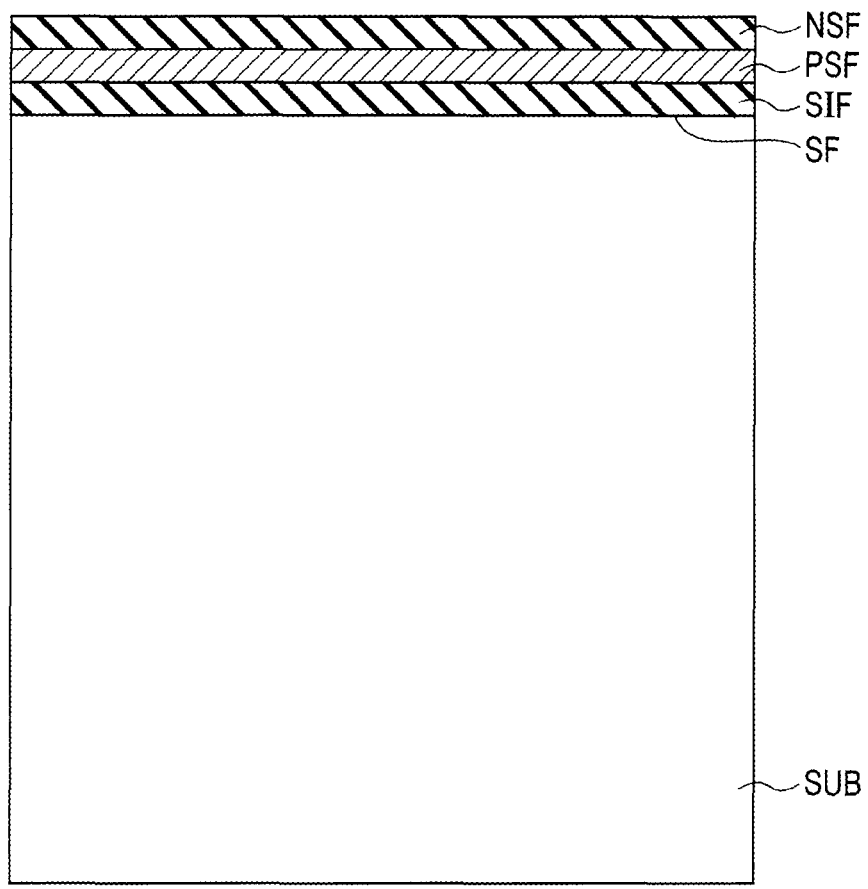
FIG. 12 is a schematic sectional view showing the first step of a method for manufacturing a deep isolation insulating layer with an air gap for STI.

Referring to FIG. 12, a silicon oxide film SIF, a polycrystalline silicon film PSF, and a silicon nitride film NSF are stacked over one main surface SF of a semiconductor substrate SUB, for example, of silicon, for example, by CVD (Chemical Vapor Deposition) in the order of mention. It should be noted that a process for forming a deep isolation region SI inside the semiconductor substrate SUB is described below to simplify the explanation, though a deep isolation region SI is formed above the semiconductor substrate SUB and semiconductor layer DPW in this embodiment.

Figure 13:
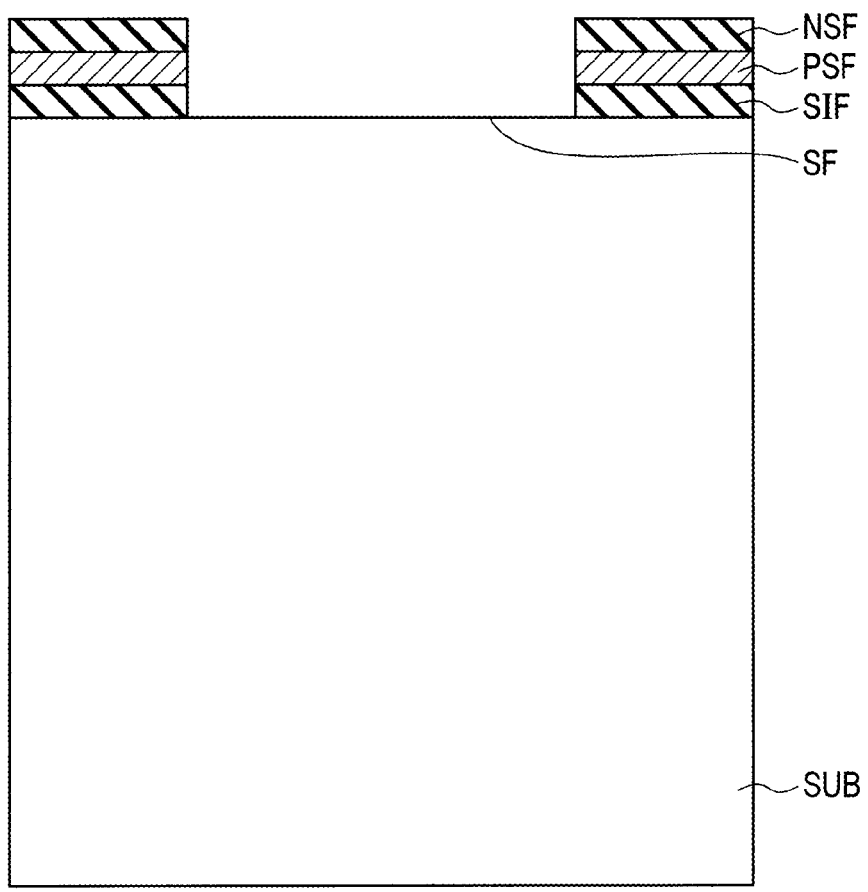
FIG. 13 is a schematic sectional view showing the second step of a method for manufacturing a deep isolation insulating layer with an air gap for STI.

Referring to FIG. 13, patterning is done on the silicon oxide film SIF, polycrystalline silicon film PSF, and silicon nitride film NSF, for example, by an ordinary photoengraving technique or etching. The parts of the above thin films which have been removed by patterning are regions where the isolation insulating layer SI is to be formed.

Figure 14:
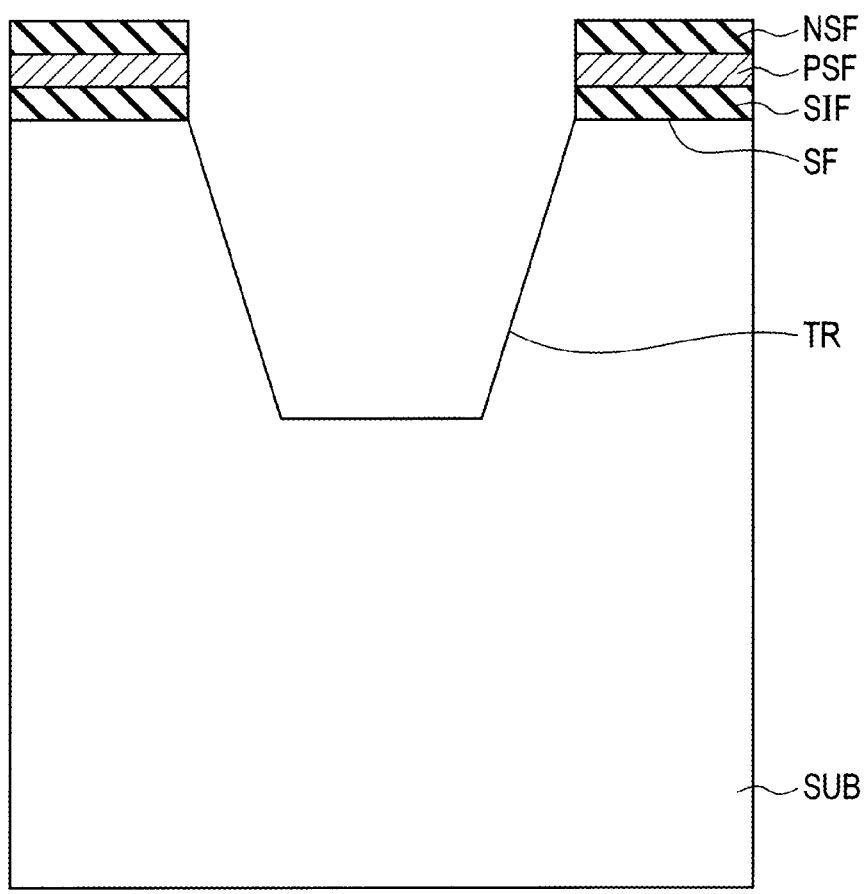
FIG. 14 is a schematic sectional view showing the third step of a method for manufacturing a deep isolation insulating layer with an air gap for STI.

Referring to FIG. 14, using as a hard mask the pattern made with the silicon oxide film SIF, polycrystalline silicon film PSF, and silicon nitride film NSF at the step shown in FIG. 13, part of the inside of the silicon substrate SUB is removed by anisotropic etching to make a trench TR.

Figure 15:
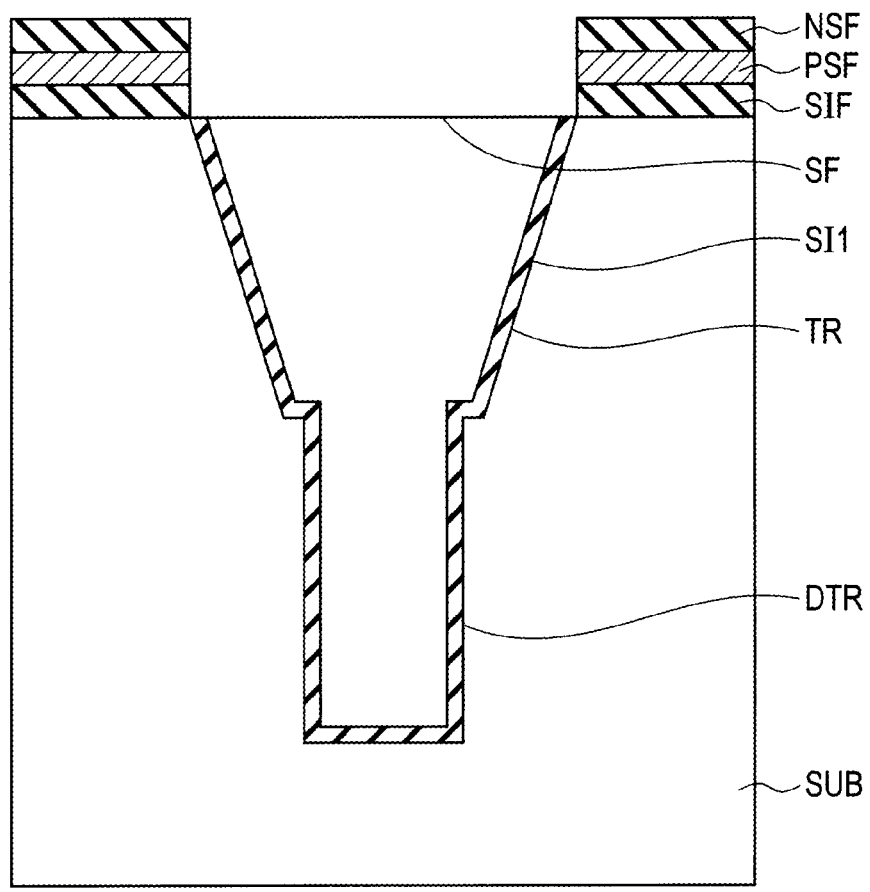
FIG. 15 is a schematic sectional view showing the fourth step of a method for manufacturing a deep isolation insulating layer with an air gap for STI.

Referring to FIG. 15, the trench TR made at the step shown in FIG. 14 is anisotropically etched further to make a deep trench DTR in a deeper region than the trench TR. The deep trench DTR is formed in a way to be continuous with the trench TR. Then, the inner wall surface of the trench TR and the inner wall surface and bottom surface of the deep trench DTR are oxidized by a known technique such as ISSG (In Situ Steam Generation) to form a silicon oxide film SI1. By forming the silicon oxide film SI1 on the inner wall surface of the trench TR or the like, the interface state density between the trench TR (deep trench DTR) and the silicon substrate SUB can be decreased to prevent a dark current from flowing between the silicon substrate SUB and trench TR (deep trench DTR).

Figure 16:
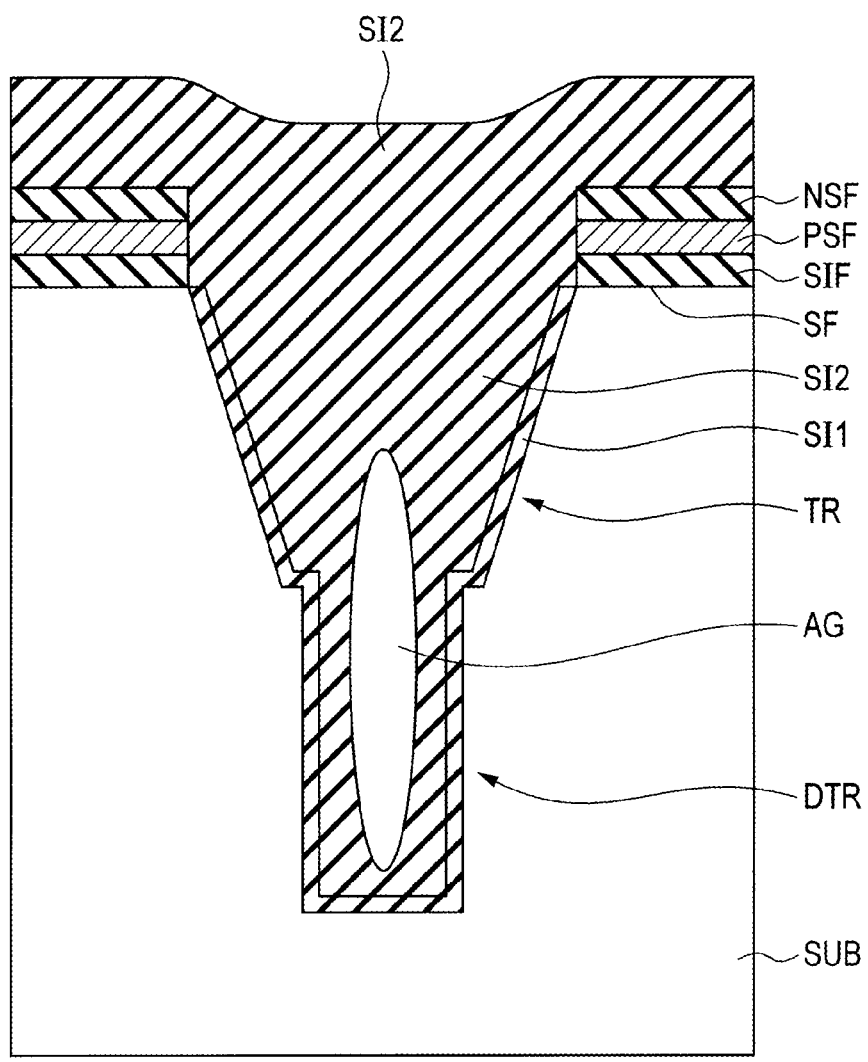
FIG. 16 is a schematic sectional view showing the fifth step of a method for manufacturing a deep isolation insulating layer with an air gap for STI.

Referring to FIG. 16, the inside of the trenches TR and DTR is filled, for example, with silicon oxide film SI2. The silicon oxide film SI2 is formed, for example, by a CVD process. At this time, an air gap AG can be produced inside the silicon oxide film SI2 which fills the trenches, by controlling the gas flow ratio and partial pressure used in the CVD process. Preferably the width of the air gap AG (in the horizontal direction of FIG. 16) should be not less than 0.01 μm and not more than 0.1 μm.

Figure 17:
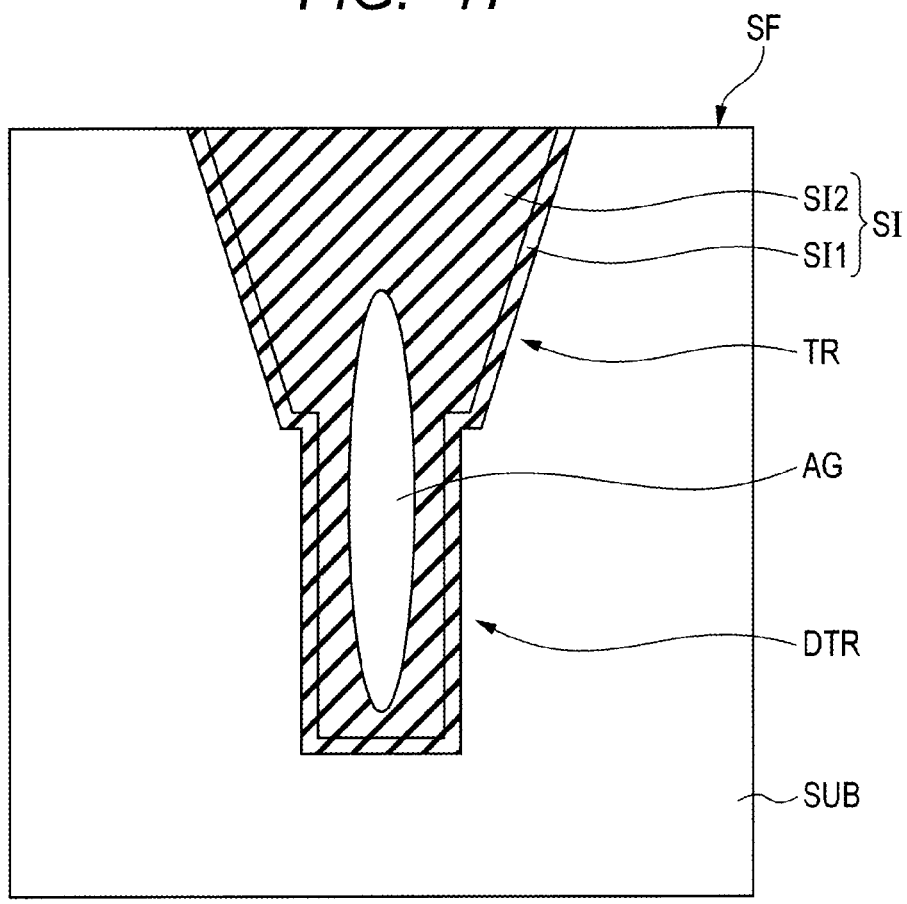
FIG. 17 is a schematic sectional view showing the sixth step of a method for manufacturing a deep isolation insulating layer with an air gap for STI.

Referring to FIG. 17, the silicon oxide film SI2 which is deposited over the top surface SF of the semiconductor substrate SUB at the same time the inside of the trenches TR and DTR shown in FIG. 16 is filled with the silicon oxide film SI2 is removed, for example, by CMP (Chemical Mechanical Polishing). The isolation insulating layer SI which includes the silicon oxide films SI1 and SI2 and contains the air gap AG is produced by carrying out the above steps.

The above embodiment may also be applied to the pixel array formed on the back surface of the semiconductor substrate of a CMOS image sensor based on the BSI (backside illumination) technique (for example, the bottom surface of the semiconductor substrate SUB shown in FIG. 5).

Second Embodiment

The second embodiment is different from the first embodiment in the electrical isolation layer structure. Next, a pixel array according to the second embodiment will be described referring to FIGS. 18 to 20.

Figure 18:
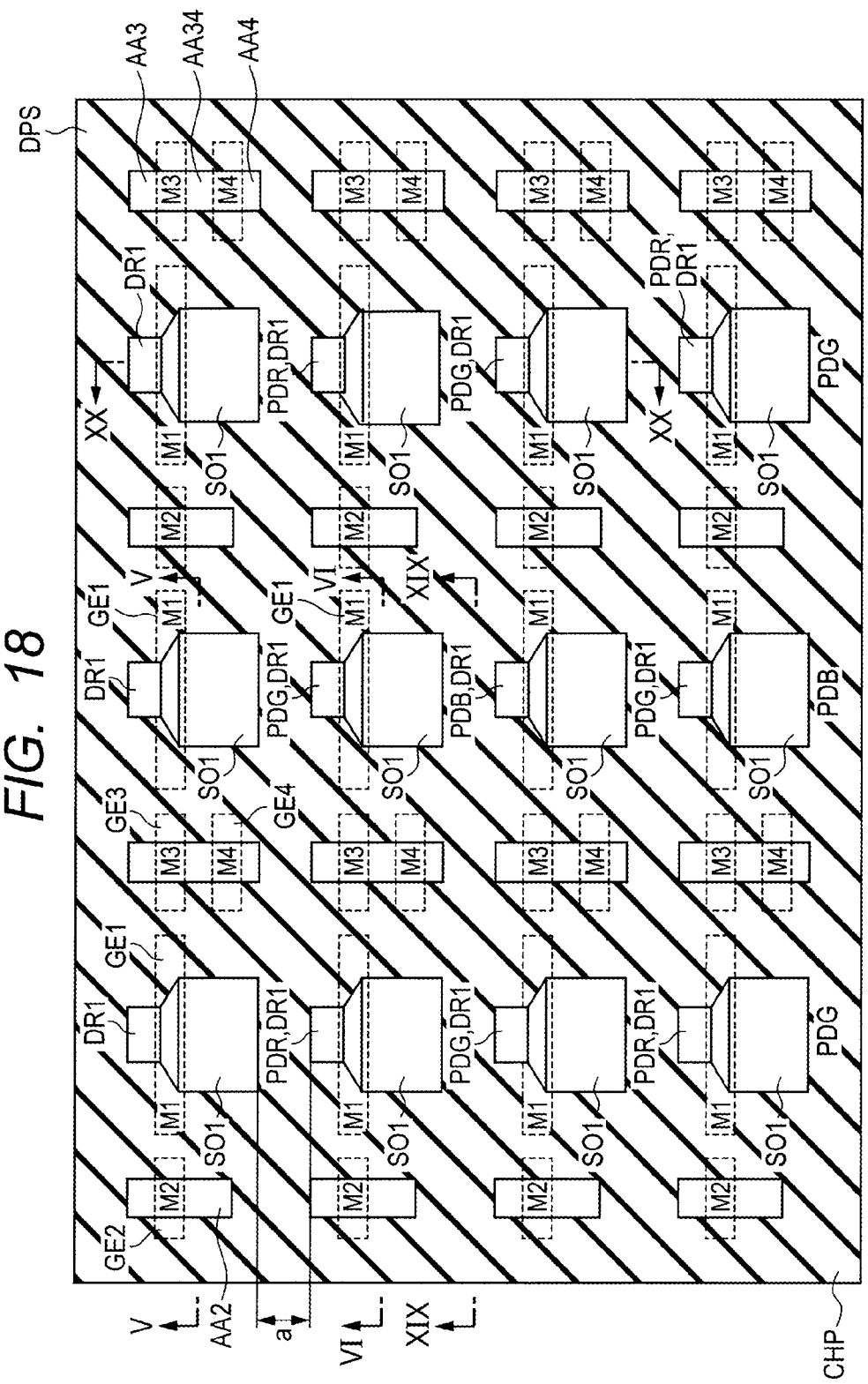
FIG. 18 is a schematic plan view showing the arrangement of a plurality of unit pixels in a pixel array according to a second embodiment of the present invention.
Figure 19:
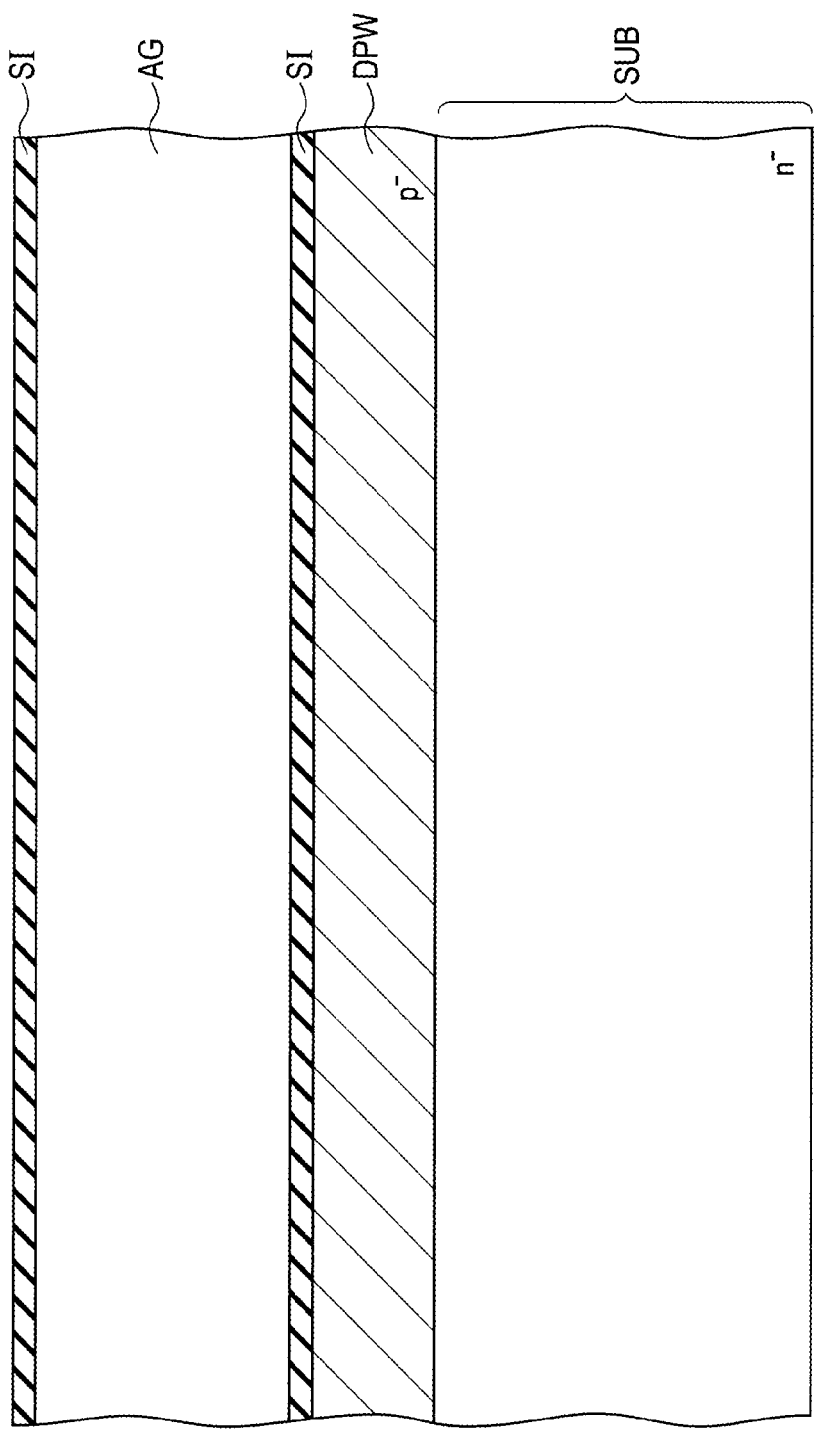
FIG. 19 is a schematic sectional view taken along the line XIX-XIX of FIG. 18.
Figure 20:
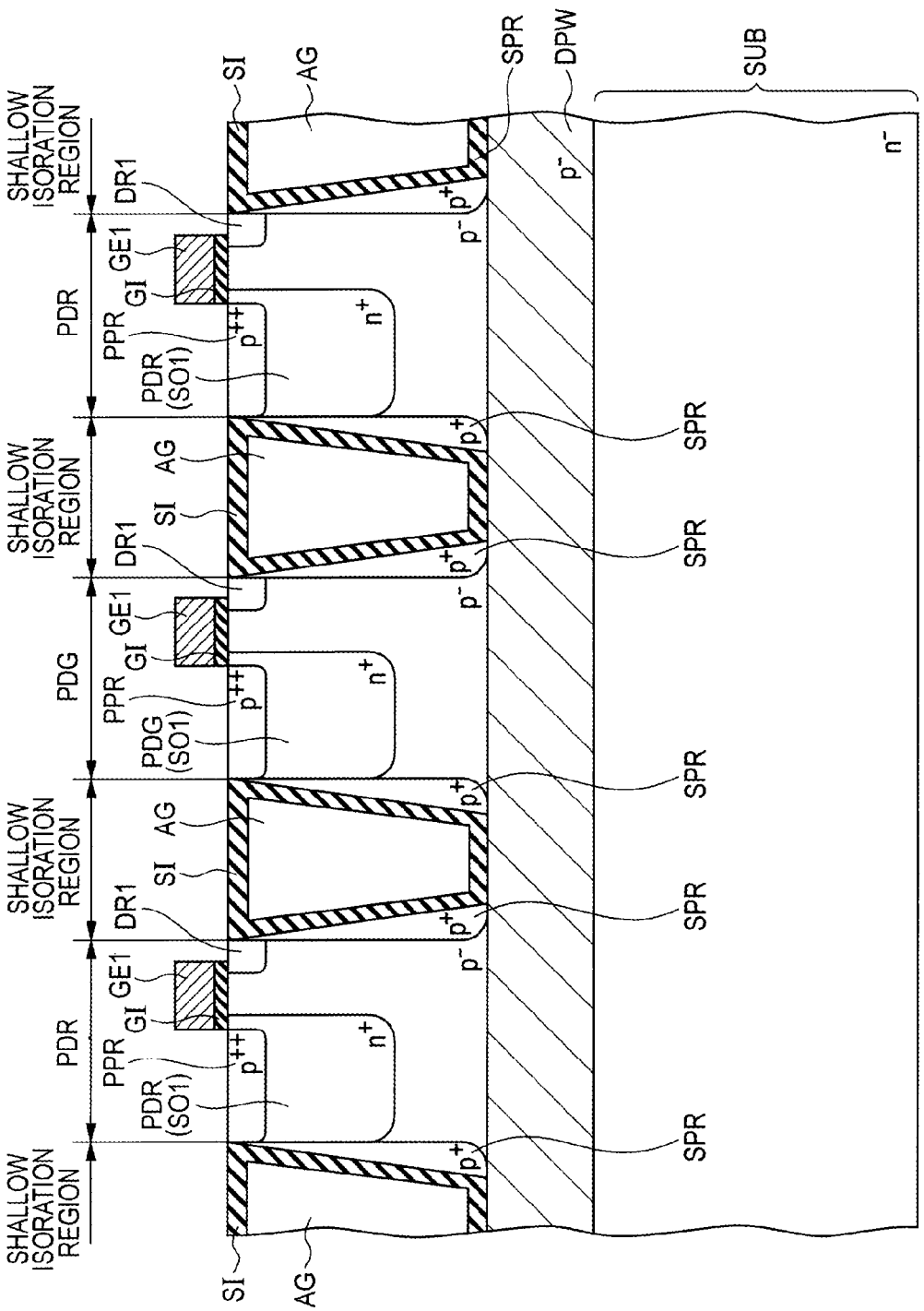
FIG. 20 is a schematic sectional view taken along the line XX-XX of FIG. 18.

Referring to FIGS. 18 to 20, the pixel array according to the second embodiment is structurally almost the same as the pixel array according to the first embodiment as shown in FIG. 3. However, in the second embodiment, all the electrical isolation layers are isolation insulating layers SI as deep isolation regions DPS in the first embodiment. Specifically, for example, an isolation insulating layer SI as a deep isolation region DPS is formed in the region between the source region SO1 of a transistor M1 and the drain region DR1 of a transistor M1 adjacent to that transistor M1 as the active region nearest to the source region in a plan view. This isolation insulating layer SI has a sufficient depth to reach the semiconductor layer DPW like the isolation insulating layer SI shown in FIGS. 5 to 7 and the lowest part of its air gap is in a position deeper than the lowest part of the photodiode. As a consequence, the isolation insulating layer SI as a deep isolation region DPS lies in all regions where transistors M1 to M4 are not located.

For example, regarding a pair of transistors M1 adjacent to each other in the vertical direction of FIG. 18, it is preferable that the width a of the region between the source region SO1 of one transistor M1 and the drain region DR1 of the other transistor M1 should be larger than the width a of the corresponding region in FIG. 3. If so, that region's aspect ratio, or the ratio of its width in a plan view to the depth of the isolation insulating layer SI, is smaller. Therefore, a deep isolation insulating layer SI with a relatively deep air gap AG can be formed easily and a deep isolation insulating layer SI can be formed in almost the whole pixel array (except the regions where transistors are located).

Referring to FIG. 19, the isolation insulating layer SI as a deep isolation region DPS extends continuously in the horizontal direction like the region between one transistor M1 of a pair of transistors M1 shown in FIG. 18 and the other transistor M1 adjacent to it in the vertical direction. As a consequence, the air gap AG of the isolation insulating layer SI extends continuously in the horizontal direction of the figure (along the main surface of the semiconductor substrate SUB) so as to interconnect the active regions of the plural transistors M1 shown in FIG. 18. In the isolation insulating layer SI as a deep isolation region DPS in the aforementioned first embodiment as well, its air gap AG may extend along the main surface of the semiconductor substrate as shown in FIG. 19.

As discussed above, the deep isolation region DPS is formed more extensively in the second embodiment than in the first embodiment. In this aspect, the second embodiment is different from the first embodiment. However the second embodiment is the same as the first embodiment in the other aspects, so the same elements are designated by the same reference numerals and their description is not repeated.

Next the effect of the second embodiment will be described. In the second embodiment, the deep isolation region DPS is formed more extensively than in the first embodiment. In the second embodiment, even a region which corresponds to a shallow isolation region SLS in the first embodiment is a deep isolation region DPS. This means that in a plan view, virtually the whole area around each transistor M1 (photodiode) is covered by the isolation insulating layer SI shown in FIG. 20. The lowest part of the isolation insulating layer SI abuts on the top surface of the semiconductor layer DPW and the lowest part of the air gap AG is in a position deeper than the lowest part of the photodiode.

Therefore, in the second embodiment, the deep isolation region SI is more effective in preventing inter-pixel crosstalk than in the first embodiment. Also, as shown in FIG. 19, in the second embodiment, the air gap AG is formed so as to couple the region between the active regions of a pair of neighboring transistors M1 to that of another pair (namely interconnect the areas around plural transistors M1). Therefore, the isolation insulating layer SI prevents optical crosstalk more effectively.

The second embodiment of the present invention is different from the first embodiment of the invention only in the above aspect. In other words, the other aspects of the second embodiment including the configuration, condition, procedure and effect are the same as in the first embodiment.

EXAMPLE 1

Next, a simulation concerning how the CMOS image sensors in the first and second embodiments prevent inter-pixel crosstalk will be described. First, the simulation method will be described referring to FIGS. 21 and 22.

Figure 21:
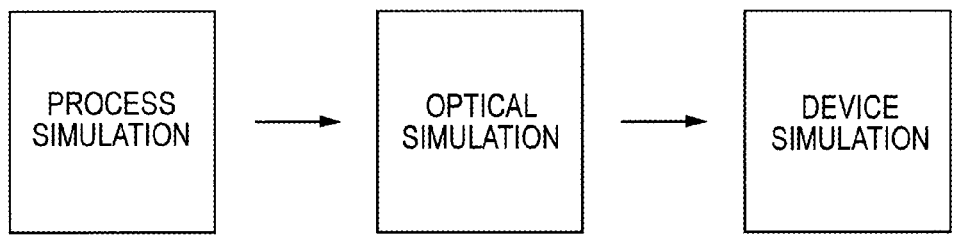
FIG. 21 is a flowchart showing a simulation sequence for the spectral characteristics of the CMOS image sensor according to the first embodiment of the invention.

Referring to FIG. 21, a process simulation is first carried out. Concretely, the structure of each unit pixel of the CMOS image sensor according to the second embodiment and that of the CMOS image sensor as the comparative example are simulated. For example, the structure of a unit pixel includes the following factors: the materials and shapes of the components of the color filter, transistors and photodiode of the pixel, and the semiconductor substrate and the impurity concentration distributions in the impurity regions. This information is entered in a computer and the computer makes a calculation to express the structure of the unit pixel in numerical terms.

The next step is optical simulation. Concretely, focusing on the photodiode of each unit pixel (including the surrounding isolation insulating layer and semiconductor layer), the density distribution of electrons generated by photoelectric conversion (photogenerated electron density distribution) which depends on the amount of light entering the photodiode is calculated.

Lastly, device simulation is performed. Concretely, time dependence of applied voltage for operation of each unit pixel including the color filter and isolation regions (isolation insulating layer SI, etc.) is entered in the computer. Then, using the photogenerated electron density distribution calculated by optical simulation as an initial value (time t=0), the computer calculates the change over time concerning the accumulation of electrons generated by photoelectric conversion in the photodiodes of the pixels by diffusion or drifting. The calculation is ended when significant change over time in the accumulation of such electrons in the photodiodes becomes no longer observed (namely a steady state is attained).

Figure 22:
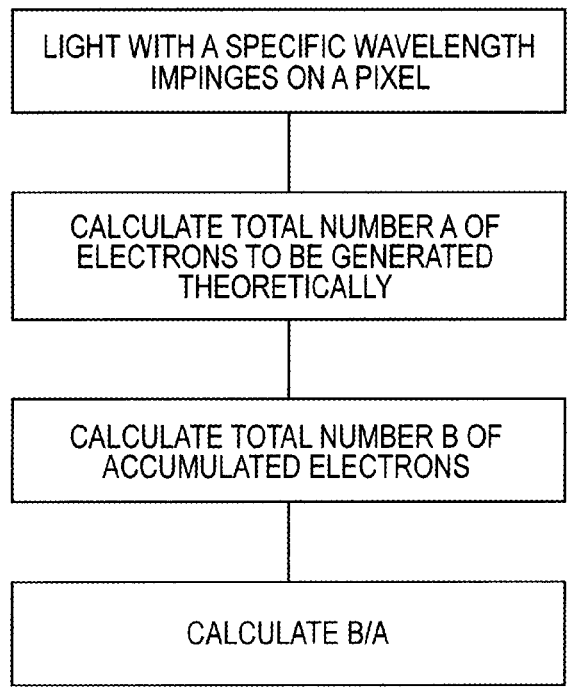
FIG. 22 is a flowchart showing a sequence for calculating the wavelength dependence of spectral sensitivity of unit pixels configuring the CMOS image sensor according to the first embodiment.

Referring to FIG. 22, in order to calculate the spectral sensitivity (of the photodiode) of each unit pixel, data on light with a specific wavelength impinging on the unit pixel (photodiode) is first entered in the computer. Then the total number A of electrons to be generated theoretically is calculated. Concretely the total number A of electrons here means the total number of electrons which are generated theoretically by photoelectric conversion according to the amounts of light with different wavelengths (optical energies with different wavelengths) entering pixels (including the photodiodes, the isolation insulating layers SI around the photodiodes, and the semiconductor layer DPW) as calculated by the above optical simulation. Then, the total number B of accumulated electrons is calculated. Concretely the total number B of electrons here means the total number of electrons accumulated in the photodiodes by diffusion or drifting among the electrons generated by photoelectric conversion according to the amounts of light with different wavelengths entering the pixels. Then quantum efficiency B/A, which is equivalent to spectral sensitivity, is calculated.

Figure 23:
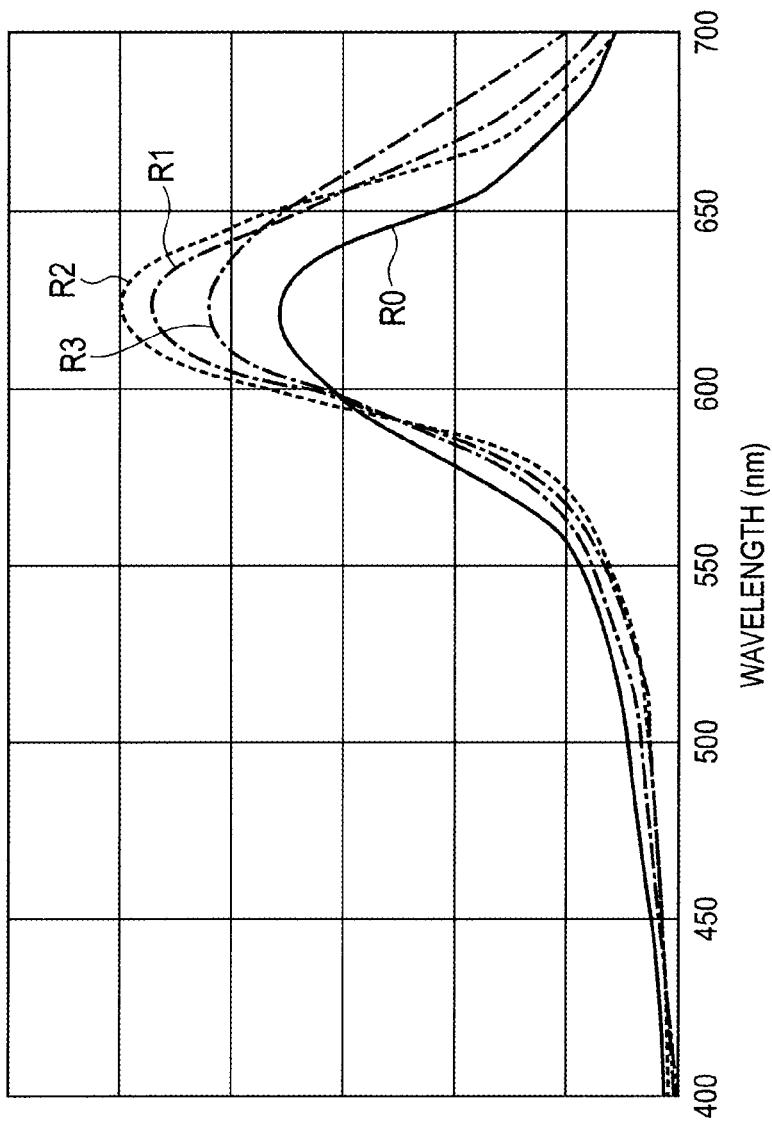
FIG. 23 is a graph showing the simulation result of wavelength dependence of spectral sensitivity for a unit pixel having a photodiode with a red color filter.
Figure 24:
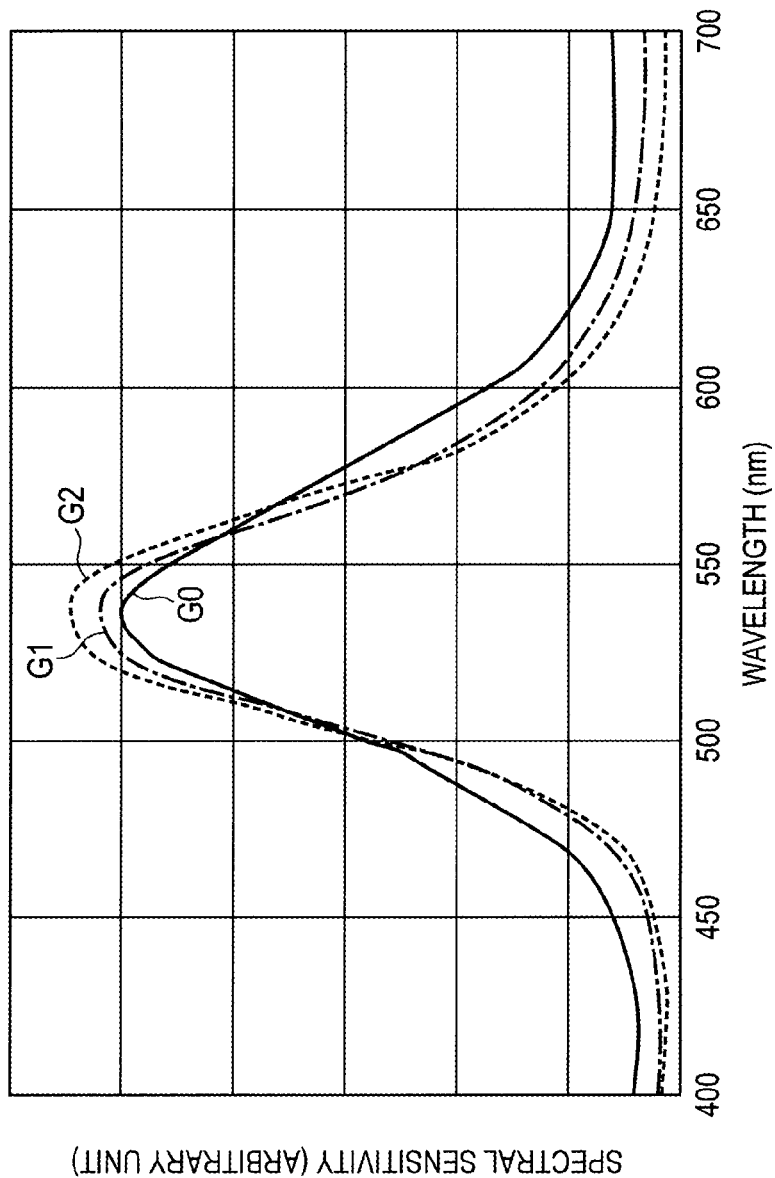
FIG. 24 is a graph showing the simulation result of wavelength dependence of spectral sensitivity for a unit pixel having a photodiode with a green color filter.
Figure 25:
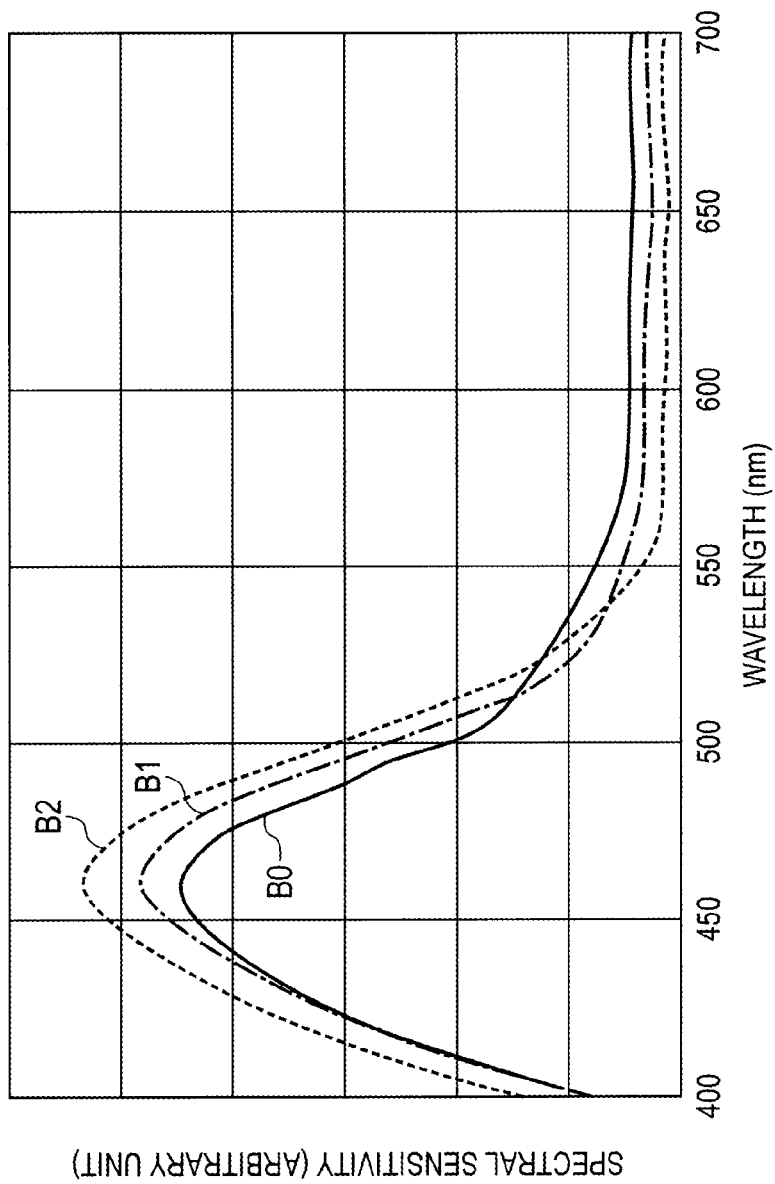
FIG. 25 is a graph showing the simulation result of wavelength dependence of spectral sensitivity for a unit pixel having a photodiode with a blue color filter.

FIGS. 23 to 25 are graphs showing the results of calculations by the above simulation sequence. In FIGS. 23 to 25, the horizontal axes represent the wavelengths of light impinging on the photodiodes having red, green, and blue color filters, respectively and the vertical axes represent spectral sensitivities as the ratios of accumulation in the photodiodes of electrons generated from light with different wavelengths. The spectral sensitivity in the vertical axis of FIGS. 23 to 25 can be expressed in an arbitrary unit, for example, by the actual numerical value of B/A or logarithm of B/A. However, the scale used to express spectral sensitivity is common among FIGS. 23 to 25 in which the same maximum and minimum values are used in all the graphs. This makes comparison in spectral sensitivity among the graphs of FIGS. 23 to 25 easy.

Curves R0, G0, and B0 which are indicated by solid line in FIGS. 23 to 25 respectively are the simulation results of the comparative example shown in FIG. 11, namely the pixel array in which the transistors M1 to M4 are each surrounded only by the shallow isolation regions SLS as a laminated structure comprised of the insulating layer SSP and p$^+$ type region SP in a plan view. Curves R1, G1, and B1 which are indicated by dot-dash line in FIGS. 23 to 25 respectively are the simulation results of the pixel array in the first embodiment shown in FIG. 3 in which some electrical isolation layers are deep isolation regions DPS (shown in FIGS. 5 to 7) and other electrical isolation layers are shallow isolation regions SLS (shown in FIG. 8). Curves R2, G2, and B2 which are indicated by dotted line in FIGS. 23 to 25 respectively are the simulation results of the pixel array in the second embodiment shown in FIG. 18 in which all the electrical isolation layers are deep isolation regions DPS (shown in FIGS. 5 to 7 and FIG. 20).

Curve R3 in FIG. 23 is the simulation result of the red photodiode PDR in the pixel array having an isolation insulating layer SI as a deep isolation region DPS in which the lowest part of the air gap AG is in a position shallower than the lowest part of the photodiode as shown in FIG. 9.

Referring to FIGS. 23 to 25, for example, the wavelength of red light is in the range from 600 nm to 650 nm, so in the graph of FIG. 23 (which concerns the photodiode with a red color filter), R0, R1, and R2 all show higher spectral sensitivities in the above wavelength range than in the other wavelength ranges. Similarly, in the graph of FIG. 24 (which concerns the photodiode with a green color filter), G0, G1, and G2 all show higher spectral sensitivities in the wavelength range from 500 nm to 580 nm, inherent to green light, than in the other wavelength ranges. In the graph of FIG. 25 (which concerns the photodiode with a blue color filter), B0, B1, and B2 all show higher spectral sensitivities in the wavelength range from 400 nm to 480 nm, inherent to blue light, than in the other wavelength ranges.

In FIG. 23, R0 is the lowest in terms of peak spectral sensitivity for red light, R3 is the second lowest, and R2 is the highest. In the comparative example, the red photodiode PDR (FIG. 11) is surrounded only by shallow isolation regions. The electrons into which red light entering on the red photodiode is converted are more likely to diffuse or drift outside the red photodiode due to electrical crosstalk, resulting in a decrease in the ratio of accumulation of electrons generated from red light in the red photodiode. Therefore, R0 is lower in peak spectral sensitivity for red light than R1, R2, and R3.

In the first embodiment, the red photodiode PDR (FIG. 3) is partially surrounded by a shallow isolation region and partially surrounded by a deep isolation region. For this reason, in the first embodiment, electrical crosstalk is less likely to occur than in the comparative example and the peak spectral sensitivity for red light is higher. However, R1, which relates to the deeper air gap AG of the deep isolation region DPS in the first embodiment, is higher in the peak spectral sensitivity for red light than R3, which relates to the shallower air gap AG in the first embodiment. This is because the air gap AG increases the optical crosstalk preventive effect.

In the second embodiment in which the lowest part of the air gap AG is in a shallower position, almost the whole of each red photodiode PDR (FIG. 18) is surrounded by a deep isolation region. Therefore, in the second embodiment, electrical crosstalk and optical crosstalk are more effectively prevented and the peak spectral sensitivity for red light is higher than in the first embodiment.

On the other hand, referring to FIG. 23, in the ranges of shorter wavelengths than the wavelength range of red light (for example, in the range of 580 nm and shorter wavelengths), R0 is the highest in spectral sensitivity, R1 is the second highest, and R2 is the lowest. This is because in the comparative example, due to optical crosstalk, light which has passed, for example, through the green color filter is more likely to enter the red photodiode than in the embodiments of the invention. By contrast, in the embodiments, since such optical crosstalk is suppressed, light which has passed, for example, through the green color filter is less likely to enter the red photodiode. For this reason, spectral sensitivity is lower in wavelength ranges other than the wavelength range of red light in the embodiments than in the comparative example. This tendency is more apparent in the second embodiment than in the first embodiment.

Although the result of observation only related to the red photodiode as shown in FIG. 23 has been discussed above, the results of observation related to the green and blue photodiodes as shown in FIGS. 24 and 25 are the same as above.

In addition, the peak spectral sensitivities related to the red photodiode as shown in FIG. 23 are lower than those related to the green and blue photodiodes in FIGS. 24 and 25, in particular in the comparative example. The reason for this is that red light has a longer wavelength than green light and blue light and is more likely to cause optical cross talk and enter an adjacent photodiode.

It should be interpreted that the embodiments and example are just illustrative and not restrictive. The scope of the present invention is defined by the appended claims rather than by the description preceding them, and all changes that fall within metes and bounds of the claims, or equivalence of such metes and bounds are therefore intended to be embraced by the claims.

The present invention is particularly advantageous when it is applied to semiconductor devices having CMOS image sensors.

What is claimed is:

1. A semiconductor device comprising:
a semiconductor substrate having a main surface;
a first conductivity type impurity layer located over the main surface of the semiconductor substrate;
a plurality of unit pixels arranged in a matrix pattern, each unit pixel including
a photoelectric transducer including a first conductivity type impurity region and a second conductivity type impurity region which are joined to each other over the first conductivity type impurity layer; and
a transistor configuring a unit pixel including the photoelectric transducer and being electrically coupled to the photoelectric transducer,
wherein at least part of an area around the photoelectric transducer in a plan view contains an air gap and has an isolation insulating layer for electrically insulating the one photoelectric transducer and another photoelectric transducer adjacent to the one photoelectric transducer from each other, and
wherein the isolation insulating layer abuts on a top surface of the first conductivity type impurity layer,
wherein a bottom of the air gap is in a position deeper than a bottom of the photoelectric transducer,
wherein each unit pixel includes a first transistor formed in a first active region including a first impurity region as the photoelectric transducer and a second impurity region as an impurity diffusion layer, and a second transistor, which is electrically coupled to the first transistor and formed in a second active region including an impurity region as an impurity diffusion layer, and
wherein a shortest distance between the first active region of the first transistor included in one unit pixel of a pair of neighboring unit pixels among the plural unit pixels and the first active region of the first transistor included in the other unit pixel of the pair of unit pixels is smaller than a shortest distance between the first active region of the first transistor and the second active region of the second transistor adjacent to the first transistor in a plan view.

2. The semiconductor device according to claim 1, wherein a side face of the isolation insulating layer is covered by a first conductivity type impurity thin film.

3. The semiconductor device according to claim 1, wherein the isolation insulating layer is located in a region between the first active region of the first transistor and the second active region of the second transistor adjacent to the first transistor in a plan view.

4. The semiconductor device according to claim 3, wherein the isolation insulating layer is located in a region between the first active region included in one transistor of a pair of the first transistors and the first active region of the other first transistor nearest to the first active region in a plan view among the first active regions of the pair.

5. The semiconductor device according to claim 3, wherein the isolation insulating layer is located all over a region in which the transistors are not located in a plan view.

6. The semiconductor device according to claim 3, wherein the air gap of the isolation insulating layer extends along the main surface so as to couple the first active regions adjacent to each other.

7. The semiconductor device according to claim 1, wherein an element isolation layer which is shallower than the isolation insulating layer and does not abut on the first conductivity type impurity layer is located in a region between the first active region included in one transistor of a pair of the first transistors and the first active region of the other first transistor nearest to the first active region in a plan view among the first active regions of the pair.

* * * * *